(12) United States Patent
Fukuda

(10) Patent No.: US 10,200,622 B2
(45) Date of Patent: Feb. 5, 2019

(54) IMAGE PROCESSING METHOD, IMAGE PROCESSING APPARATUS, AND IMAGING APPARATUS

(71) Applicant: CANON KABUSHIKI KAISHA, Tokyo (JP)

(72) Inventor: Koichi Fukuda, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/849,487

(22) Filed: Dec. 20, 2017

(65) Prior Publication Data

US 2018/0183984 A1 Jun. 28, 2018

(30) Foreign Application Priority Data

Dec. 28, 2016 (JP) .................... 2016-256758

(51) Int. Cl.
*H04N 5/225* (2006.01)
*H04N 5/232* (2006.01)
*G06T 1/00* (2006.01)
*H04N 5/235* (2006.01)
*G06T 5/50* (2006.01)

(52) U.S. Cl.
CPC ........... *H04N 5/235* (2013.01); *G06T 1/0007* (2013.01); *G06T 5/50* (2013.01); *H04N 5/2254* (2013.01); *H04N 5/23212* (2013.01); *H04N 5/23296* (2013.01)

(58) Field of Classification Search
None
See application file for complete search history.

(56) References Cited

U.S. PATENT DOCUMENTS 4,410,804 A 10/1983 Stauffer
2015/0145988 A1* 5/2015 Numata ................. G06T 5/002
348/135

FOREIGN PATENT DOCUMENTS

JP 2001-083407 A 3/2001

* cited by examiner

*Primary Examiner* — Mark T Monk
(74) *Attorney, Agent, or Firm* — Canon U.S.A., Inc. I.P. Division

(57) ABSTRACT

An image processing method including generating a captured image corresponding to a pupil region from an input image acquired by an image sensor in which a plurality of pixels each having a plurality of photoelectric conversion parts for receiving light fluxes passing through the different pupil partial regions of an image-forming optical system is arrayed, generating, from the input image, viewpoint images at each of the different pupil partial regions, generating corrected viewpoint images by executing light amount correction processing of each of the viewpoint images based on the captured image and the viewpoint images, executing gamma adjustment of the captured image and gamma adjustment of the corrected viewpoint images based on a signal luminance distribution of the captured image and signal luminance distributions of the corrected viewpoint images, and combining the captured image and the corrected viewpoint images according to subject luminance.

8 Claims, 23 Drawing Sheets

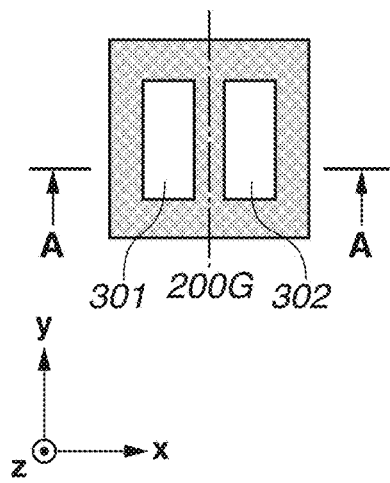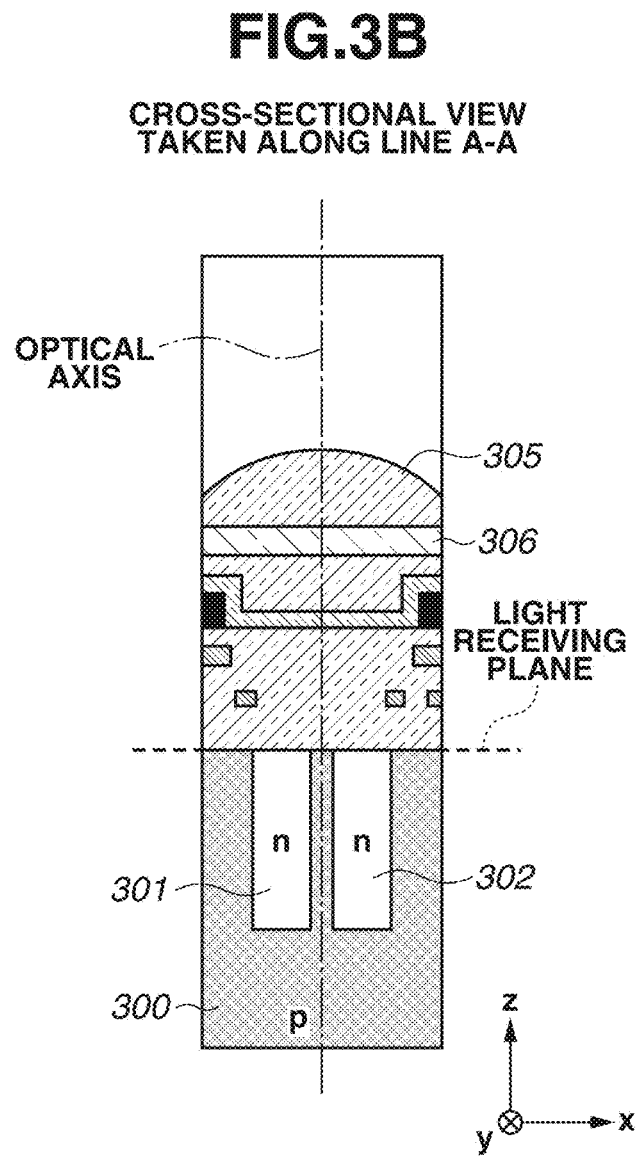

FIG.5A
CROSS-SECTIONAL VIEW
PARALLEL TO OPTICAL AXIS
FIG.5B
CROSS-SECTIONAL
VIEW VERTICAL
TO OPTICAL AXIS
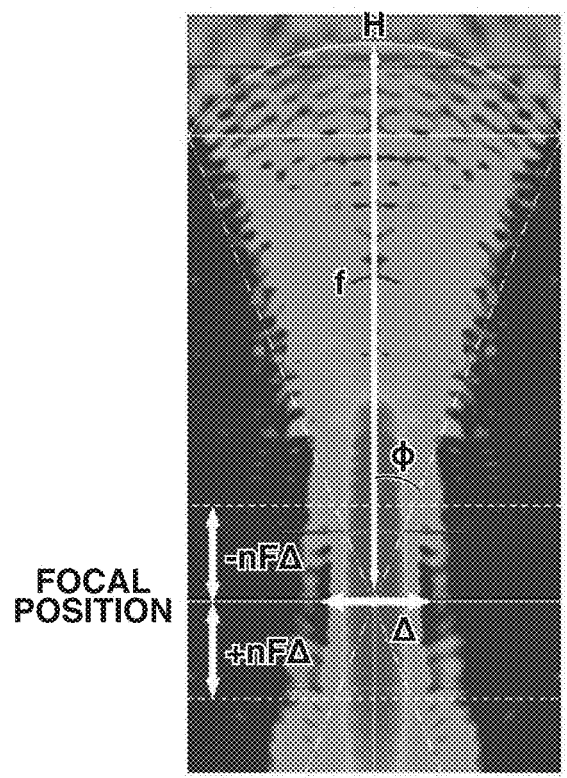
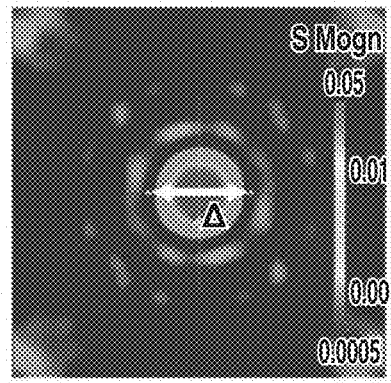

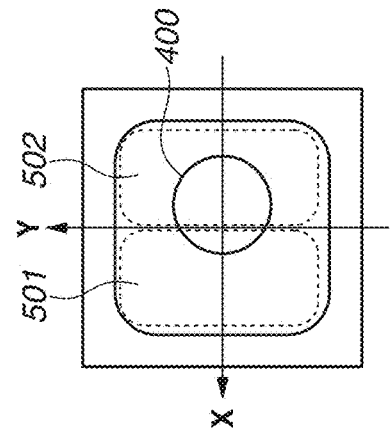 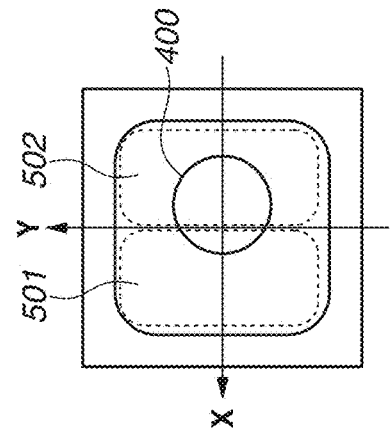 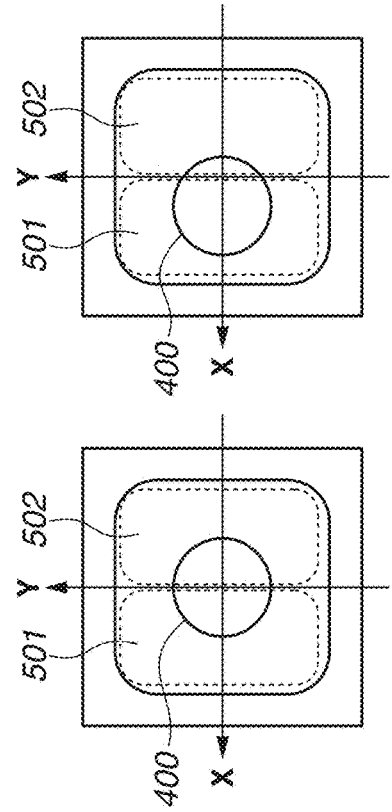 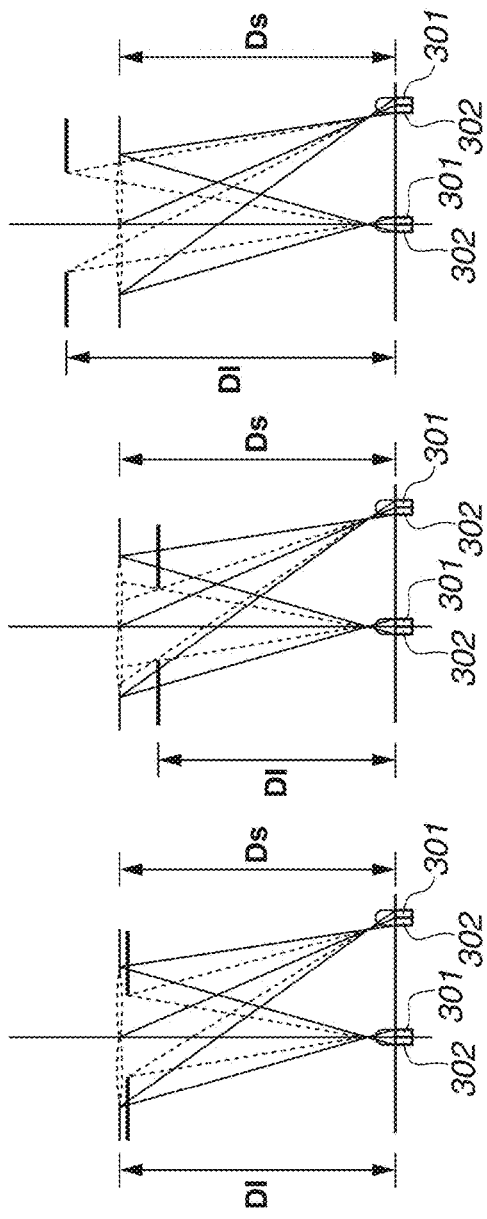

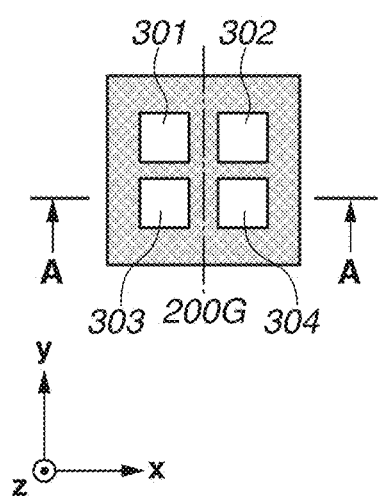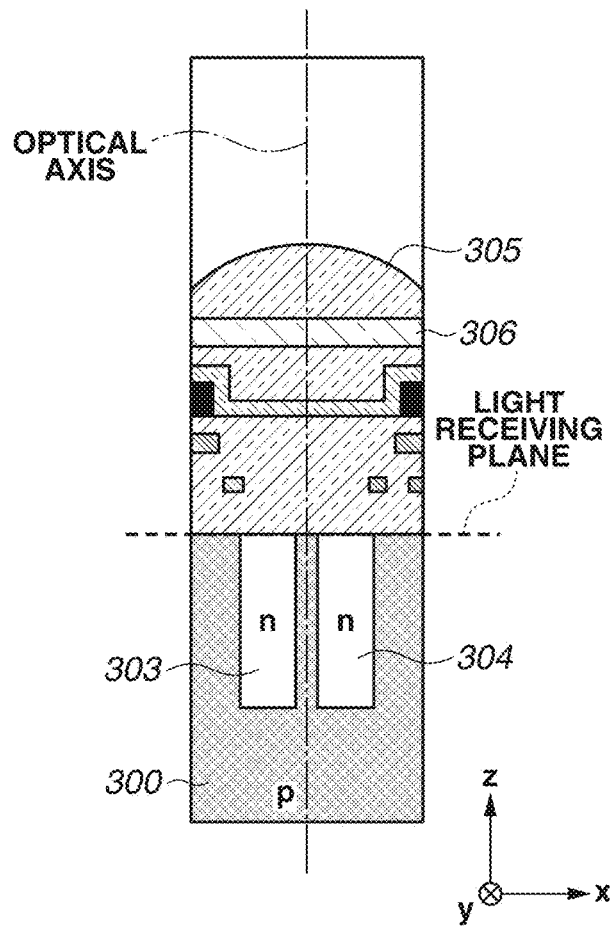

IMAGE PROCESSING METHOD, IMAGE PROCESSING APPARATUS, AND IMAGING APPARATUS

BACKGROUND OF THE INVENTION

Field of the Invention

The present invention relates to image processing of an image acquired by an image sensor in which a plurality of pixels each having a plurality of photoelectric conversion parts for receiving light fluxes passing through different pupil partial regions of an image-forming optical system is arrayed.

Description of the Related Art

As a focus detection method of an imaging apparatus, there is provided an imaging plane phase difference method in which phase difference focus detection is executed by a focus detection pixel formed on an image sensor. An imaging apparatus discussed in U.S. Pat. No. 4,410,804 uses a two-dimensional image sensor in which one micro-lens and a plurality of divided photoelectric conversion parts are formed on one pixel. The plurality of divided photoelectric conversion parts receives light from different regions of an exit pupil of an imaging lens via the one micro-lens to execute pupil division. A viewpoint signal is generated from a signal of received light at each of the divided photoelectric conversion parts. Then, an image shift amount is calculated from a disparity between a plurality of viewpoint signals and the image shift amount is converted into a defocus amount to execute phase difference focus detection. Japanese Patent Application Laid-Open No. 2001-083407 discusses a technique of generating an imaging signal by adding a plurality of viewpoint signals received by a plurality of divided photoelectric conversion parts.

The plurality of viewpoint signals related to a captured image is equivalent to light field (LF) data which is information about a spatial distribution and an angle distribution of light intensity.

Because effective aperture values of the imaging signal and the viewpoint signal acquired by the imaging apparatus described in the above-described conventional technique are different, amounts of light received thereby changes. Therefore, a combined image with an expanded dynamic range can be generated by combining the imaging signal and the viewpoint signal. However, if a defect signal, shading caused by pupil division, or a saturation signal may be generated in a part of the plurality of viewpoint images acquired by the imaging apparatus described in the above-described conventional technique, the image quality of the viewpoint images is lowered, and thus the image quality of the combined image with an expanded dynamic range may be lowered accordingly.

SUMMARY OF THE INVENTION

The present invention is directed to a method capable of generating an image of improved image quality with an expanded dynamic range.

According to an aspect of the present invention, an image processing method for generating an output image from an input image acquired by an image sensor in which a plurality of pixels each having a plurality of photoelectric conversion parts for receiving light fluxes passing through different pupil partial regions of an image-forming optical system is arrayed includes generating, from the input image, a captured image corresponding to a pupil region in which the different pupil partial regions are combined, generating, from the input image, one or more viewpoint images at each of the different pupil partial regions, generating one or more corrected viewpoint images by executing light amount correction processing on the viewpoint images based on the captured image and the viewpoint images, executing gamma adjustment of the captured image and gamma adjustment of the one or more corrected viewpoint images based on a signal luminance distribution of the captured image and signal luminance distributions of the one or more corrected viewpoint images, and generating an output image by combining the corrected viewpoint images and the captured image according to object luminance.

Further features of the present invention will become apparent from the following description of exemplary embodiments with reference to the attached drawings.

BRIEF DESCRIPTION OF THE DRAWINGS

FIGS. 3A and 3B are respectively a plan view and a cross-sectional view schematically illustrating a pixel according to the first exemplary embodiment of the present invention.

FIGS. 5A and 5B are diagrams illustrating an example of a light intensity distribution within a pixel according to the first exemplary embodiment of the present invention.

FIGS. 10A, 10B, and 10C are diagrams illustrating shading caused by a pupil shift between the first and the second viewpoint images according to the first exemplary embodiment of the present invention.

FIGS. 22A and 22B are respectively a plan view and a cross-sectional view schematically illustrating a pixel according to the second exemplary embodiment of the present invention.

DESCRIPTION OF THE EMBODIMENTS

Exemplary embodiments of the present invention will be described in detail with reference to the appended drawings. In the following exemplary embodiments, an exemplary embodiment in which the present invention is applied to an imaging apparatus such as a digital camera will be described. However, the image processing method according to the present invention is widely applicable to an apparatus for executing image processing such as an image processing apparatus, an information processing apparatus, or an electronic device.

A general configuration of a camera as an imaging apparatus to which the image processing method according to the first exemplary embodiment is applied will be described as an example.

Figure 1:
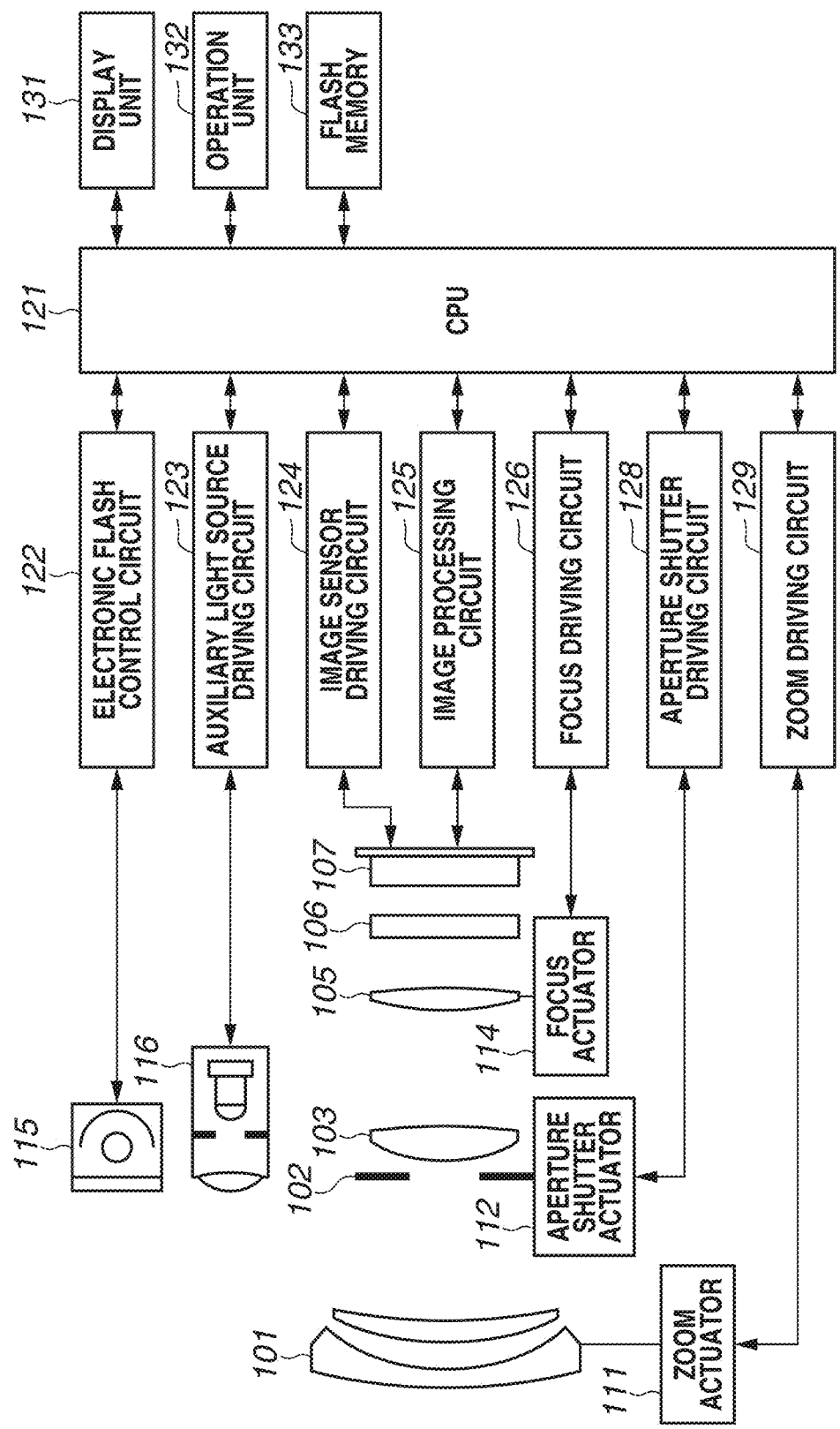
FIG. 1 is a block diagram schematically illustrating a configuration of an imaging apparatus to which an image processing method according to a first exemplary embodiment of the present invention is applied.

FIG. 1 is a block diagram illustrating an example of a configuration of an imaging apparatus including an image sensor of the present exemplary embodiment. A first lens group 101 arranged on a leading end of an imaging optical system (image-forming optical system) is held by a lens barrel to be movable back and forth in an optical axis direction. An aperture shutter 102 adjusts an opening size thereof to adjust a light amount when imaging is executed and functions as an exposure time adjusting shutter when still-imaging is executed. A second lens group 103 moves back and forth in the optical axis direction integrally with the aperture shutter 102, and executes magnification operation (zooming function) in cooperation with the back-and-forth movement of the first lens group 101. A third lens group 105 serves as a focus lens for executing focus adjustment by moving back and forth in the optical axis direction. An optical low-pass filter 106 is an optical element for reducing a false color or a moire pattern arising in a captured image. For example, an image sensor 107 is configured of a two-dimensional complementary metal oxide semiconductor (CMOS) photosensor and a peripheral circuit, and arranged on an image-forming plane of the imaging optical system.

A zoom actuator 111 moves the first lens group 101 and the second lens group 103 in the optical axis direction by rotating a cam barrel (not illustrated) to execute magnification operation. An aperture shutter actuator 112 controls the opening size of the aperture shutter 102 to adjust an imaging light amount and controls exposure time when still-imaging is executed. A focus actuator 114 moves the third lens group 105 in the optical axis direction to execute focus adjustment operation.

An electronic flash 115 for illuminating an object is used when imaging is executed. A flashlight illumination apparatus using a xenon tube or an illumination apparatus having a light-emitting diode (LED) continuously emitting light is used for the electronic flash 115. An autofocus (AF) auxiliary light source 116 projects a mask image having a predetermined opening pattern on an image sensing field via a light-projecting lens. With this configuration, focus detection performance can be improved for an object with low luminance or low contrast.

A central processing unit (CPU) 121 which constitutes a control unit of a camera main unit has a central processing function for executing various kinds of control. The CPU 121 includes a calculation unit, a read only memory (ROM), a random access memory (RAM), an analog-to-digital (A/D) converter, a digital-to-analog (D/A) converter, and a communication interface circuit. The CPU 121 drives various circuits included in the camera and executes a series of operation such as AF control, image-capturing processing, image processing, and recording processing according to a predetermined program stored in the ROM. Further, the CPU 121 functions as a data generation unit according to the present invention.

According to a control instruction of the CPU 121, an electronic flash control circuit 122 controls the electronic flash 115 to light up in synchronization with imaging operation. According to a control instruction of the CPU 121, an auxiliary light source driving circuit 123 controls the AF auxiliary light source 116 to light up in synchronization with focus detection operation. An image sensor driving circuit 124 controls imaging operation of the image sensor 107, executes A/D conversion of an acquired imaging signal, and transmits the converted imaging signal to the CPU 121. According to a control instruction of the CPU 121, an image processing circuit 125 executes processing such as gamma conversion, color interpolation, or joint photographic experts group (JPEG) compression of an image acquired by the image sensor 107.

According to a control instruction of the CPU 121, a focus driving circuit 126 drives the focus actuator 114 to move the third lens group 105 in the optical axis direction and executes focus adjustment based on a result of focus detection. According to a control instruction of the CPU 121, an aperture shutter driving circuit 128 drives the aperture shutter actuator 112 to control the opening size of the aperture shutter 102. According to a control instruction of the CPU 121, a zoom driving circuit 129 drives the zoom actuator 111 according to a zoom operation instruction of a user.

A display unit 131 includes a display device such as a liquid crystal display (LCD) device, and displays information about an imaging mode of the camera, a preview image before imaging, a confirmation image after imaging, and a focus state display image when focus detection is executed. An operation unit 132 includes operation switches such as a power switch, a release (imaging-trigger) switch, a zoom operation switch, and an imaging mode selection switch, and outputs an operation instruction signal to the CPU 121. A flash memory 133 is a storage medium attachable to and detachable from the camera main unit, which stores captured image data.

<Image Sensor>

Figure 2:
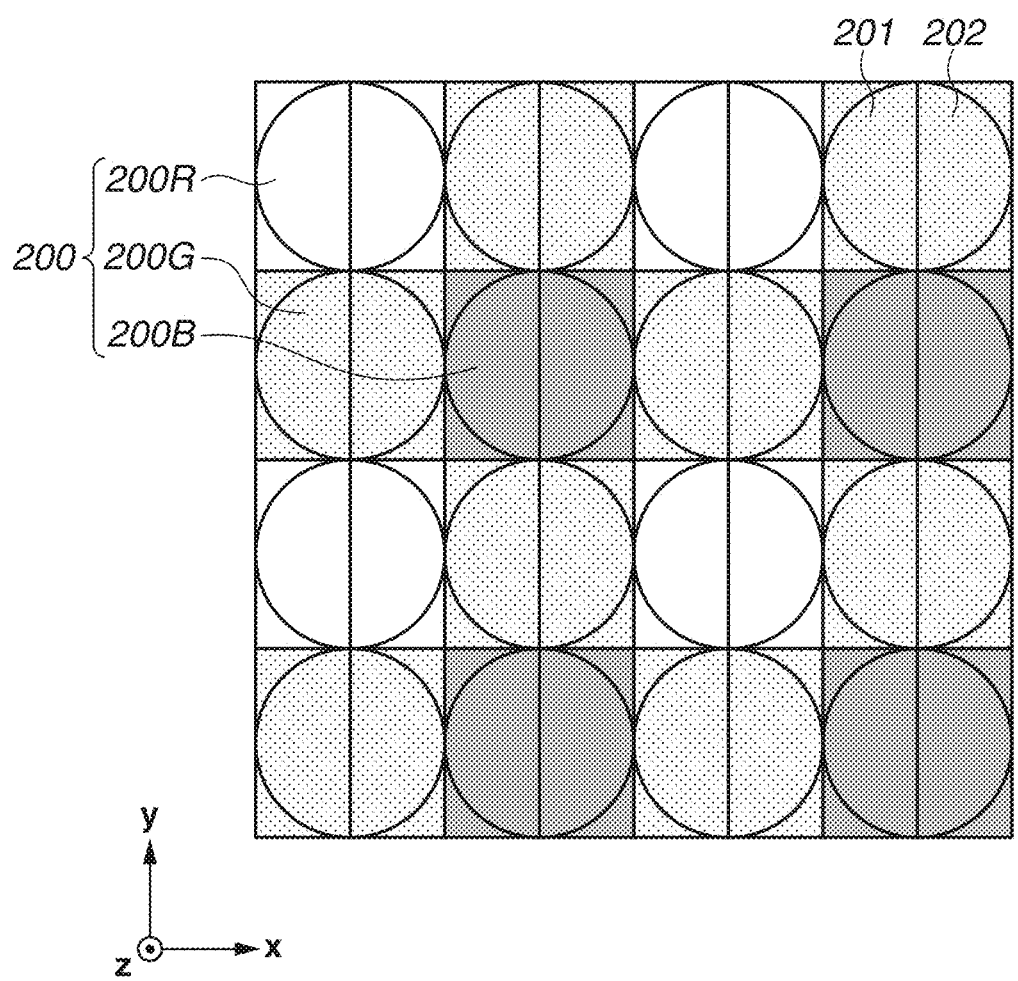
FIG. 2 is a diagram schematically illustrating pixel array according to the first exemplary embodiment of the present invention.

A schematic diagram of pixel array and sub-pixel array of the image sensor of the present exemplary embodiment is illustrated in FIG. 2. In FIG. 2, a right-left direction is defined as an x-direction (horizontal direction), an up-down direction is defined as a y-direction (vertical direction), and a direction orthogonal to the x-direction and the y-direction (direction vertical to a sheet surface) is defined as a z-direction (optical axis direction). In FIG. 2, pixel (imaging pixel) array of a two-dimensional CMOS sensor (image sensor) of the present exemplary embodiment is illustrated in a range of 4 columns by 4 rows, and sub-pixel array thereof is illustrated in a range of 8 columns by 4 rows.

In the present exemplary embodiment, a pixel group 200 which consists of 2 columns by 2 rows of pixels includes a pixel 200R having spectral sensitivity of a first color (red (R)) arranged at an upper left position, pixels 200G having spectral sensitivity of a second color (green (G)) arranged at an upper right and a lower left positions, and a pixel 200B having spectral sensitivity of a third color (blue (B)) arranged at a lower right position. Further, each pixel consists of a plurality of sub-pixels obtained by dividing each pixel into two in the x-direction (divided into Nx) and dividing each pixel into one (i.e., not divided) in the y-direction (divided into Ny), i.e., a first sub-pixel 201 and a second sub-pixel 202 (the first to the $N_{LF}$-th sub-pixels) obtained by dividing each pixel by a division number of 2 (division number $N_{LF}=Nx \times Ny$).

In the example illustrated in FIG. 2, by arranging a plurality of pixels arrayed in 4 columns by 4 rows (sub-pixels arrayed in 8 columns by 4 rows) on a plane, an input image for generating a captured image and a plurality of viewpoint images corresponding to a division number of 2 (division number $N_{LF}$) can be acquired. In the image sensor of the present exemplary embodiment, a period P of the pixel is set to 6 micrometers (μm), horizontal (column direction) pixel count $N_H$ is set to 6000 columns ($N_H$=6000 columns), vertical (row direction) pixel count $N_V$ is set to 4000 rows ($N_V$=4000 rows), so that pixel count N is set to 24 million (N=$N_H \times N_V$=24 million). Further, a column direction period $P_s$ of the sub-pixel is set to 3 82 m, and sub-pixel count $N_s$ is set to 48 million (i.e., horizontal sub-pixel count of 12000 columns×vertical sub-pixel count of 4000 rows=48 million).

One pixel 200G of the image sensor in FIG. 2 viewed on a side of a light receiving plane (+z side) of the image sensor is illustrated in a plan view in FIG. 3A. A z-axis is set in a direction vertical to a sheet surface of FIG. 3A, and a front side thereof is defined as a positive direction of the z-axis. Further, a y-axis is set in an up-down direction orthogonal to the z-axis, and an upper direction is defined as a positive direction of the y-axis. Furthermore, an x-axis is set in a right-left direction orthogonal to the z-axis and the y-axis, and a right direction is defined as a positive direction of the x-axis. A cross-sectional view taken along a line A-A in FIG. 3A, viewed on the −y side is illustrated in FIG. 3B.

As illustrated in FIG. 3A or 3B, a micro-lens 305 for collecting incident light is formed on a side of a light receiving plane (+z direction) of each pixel 200G. Further, each photoelectric conversion portion of each pixel 200G is divided into two parts in the x-direction (divided into Nx) and divided into one part in the y-direction (divided into Ny) and therefore a plurality of photoelectric conversion parts, i.e., a first photoelectric conversion part 301 and a second photoelectric conversion part 302 (the first to the $N_{LF}$-th photoelectric conversion parts) obtained by dividing each photoelectric conversion portion by a division number of 2 (division number $N_{LF}$), are formed on the pixel 200G. The first photoelectric conversion part 301 and the second photoelectric conversion part 302 (the first to the $N_{LF}$-th photoelectric conversion parts) respectively correspond to the first sub-pixel 201 and the second sub-pixel 202 (the first to the $N_{LF}$-th sub-pixels).

The first photoelectric conversion part 301 and the second photoelectric conversion part 302 are two independent p-n junction photodiodes, each including a p-type well layer 300 and separate n-type layers 301 and 302. An intrinsic layer may be interposed between the p-type well layer 300 and the n-type layers 301 and 302, and a photodiode having a p-i-n structure may be formed as appropriate. A color filter 306 is formed at a space between the micro-lens 305 and the first and the second photoelectric conversion parts 301 and 302 of each pixel. Spectral transmittance of the color filter 306 may be changed at each pixel or each photoelectric conversion part, or the color filter 306 may be omitted as appropriate.

The light incident on the pixel 200G is collected by the micro-lens 305, dispersed by the color filter 306, and received by the first photoelectric conversion part 301 and the second photoelectric conversion part 302. In the first photoelectric conversion part 301 and the second photoelectric conversion part 302, electrons and holes (positive holes) are generated as pairs according to a received light amount. Then, the electrons and the holes are separated at a depletion layer, and the electrons are accumulated in the first photoelectric conversion part 301 and the second photoelectric conversion part 302. On the other hand, the holes are discharged to the outside of the image sensor through the p-type well layer 300 connected to a constant voltage source (not illustrated). The electrons accumulated in the first photoelectric conversion part 301 and the second photoelectric conversion part 302 are transferred to a capacitance portion FD via a transfer gate to be converted into a voltage signal.

Figure 4:
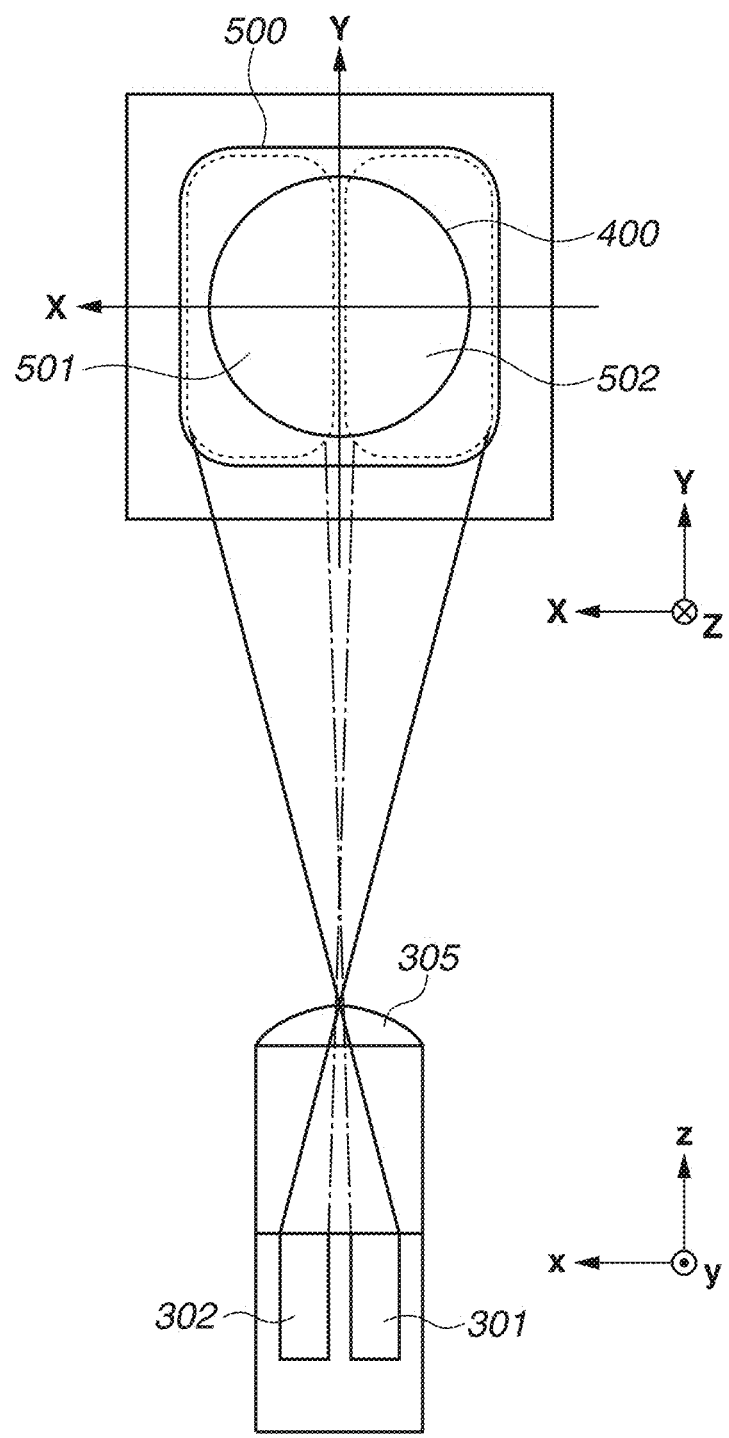
FIG. 4 is a diagram schematically illustrating a pixel and pupil division according to the first exemplary embodiment of the present invention.

FIG. 4 is a diagram schematically illustrating a correspondence relationship between a pixel structure and pupil division. A cross-sectional view of the pixel structure taken along a line A-A in FIG. 3A, viewed on the +y side and a diagram in which an exit pupil plane of the image-forming optical system is viewed in the −z direction are illustrated in FIG. 4. In FIG. 4, the x-axis and the y-axis of the cross-sectional diagram in FIG. 3A are illustrated in an inverted state in order to make the x and y axes correspond to the coordinate axes of the exit pupil plane.

The image sensor is arranged near an image-forming plane of the imaging lens (image-forming optical system), and a light flux from an object passes through an exit pupil 400 of the image-forming system and enters the respective pixels. A plane on which the image sensor is arranged is referred to as an imaging plane.

Each of a first pupil partial region 501 and a second pupil partial region 502 obtained by dividing a pupil region 500 into 2×1 (the first to the $N_{LF}$-th pupil partial regions obtained by dividing the pupil region 500 into Nx×Ny) has a substantially optically conjugate relationship with a light receiving plane of the first photoelectric conversion part 301 and the second photoelectric conversion part 302 (the first to the $N_{LF}$-th photoelectric conversion parts) via the micro-lens 305. Therefore, the first pupil partial region 501 and the second pupil partial region 502 are pupil regions where light therefrom can be received by the first sub-pixel 201 and the second sub-pixel 202 (the first to the $N_{LF}$-th sub-pixels), respectively. A centroid is decentered on the +x side on a pupil plane in the first pupil partial region 501 of the first sub-pixel 201. A centroid is decentered on the −x side on a pupil plane in the second pupil partial region 502 of the second sub-pixel 202.

Further, the pupil region 500 has a substantially optically conjugate relationship with the entire light receiving plane including the first photoelectric conversion part 301 and the second photoelectric conversion part 302 obtained by dividing a photoelectric conversion portion into 2×1 (the first to the $N_{LF}$-th photoelectric conversion parts obtained by dividing a photoelectric conversion portion into Nx×Ny) via the micro-lens 305. Therefore, the pupil region 500 is a region where light therefrom can be received by the entire pixel 200G consisting of the first sub-pixel 201 and the second sub-pixel 202 (the first sub-pixel to the $N_{LF}$-th sub-pixel).

FIGS. 5A and 5B illustrate a light intensity distribution when light is incident on a micro-lens 305 formed on each pixel. FIG. 5A illustrates a light intensity distribution of a cross-section parallel to the optical axis of the micro-lens 305. FIG. 5B illustrates a light intensity distribution of a cross-section vertical to the optical axis of the micro-lens 305 at a focal position of the micro-lens 305. The incident light is collected to the focal position by the micro-lens 305. However, due to the influence of diffraction caused by a wave property of light, a diameter of a light collecting spot cannot be reduced to a size less than a diffraction limit Δ, and thus the light collecting spot has a finite size. The light receiving plane of the photoelectric conversion part has a size of approximately 1 μm to 2 μm, whereas the light collecting spot of the micro-lens 305 has a size of approximately 1 μm. Therefore, the first pupil partial region 501 and the second pupil partial region 502 in FIG. 4, having a conjugate relationship with the light receiving planes of the photoelectric conversion parts via the micro-lens 305, cannot be divided clearly due to a diffraction blur. Thus, a light receiving rate distribution (pupil intensity distribution) is dependent on the incident angle of light.

Figure 6:
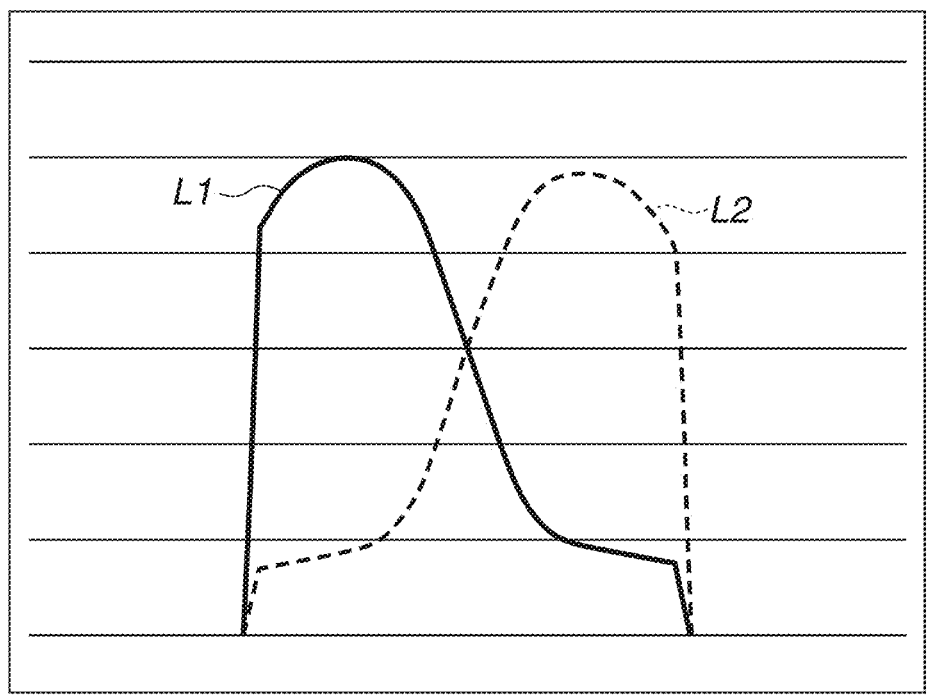
FIG. 6 is a graph illustrating an example of a pupil intensity distribution according to the first exemplary embodiment of the present invention.

An example of a light receiving rate distribution (pupil intensity distribution) dependent on the incident angle of light is illustrated in FIG. 6. A horizontal axis represents a pupil coordinate, and a vertical axis represents a light receiving rate. A graph line L1 expressed by a solid line in FIG. 6 represents a pupil intensity distribution along the X-axis of the first pupil partial region 501 in FIG. 4. The light receiving rate indicated by the graph line L1 steeply increases from a left end, reaches a peak, and gradually decreases to reach a right end with a moderate change rate. Further, a graph line L2 expressed by a dashed line in FIG. 6 represents a pupil intensity distribution along the X-axis of the second pupil partial region 502. Opposite to the case of the graph line L1, the light receiving rate indicated by the graph line L2 steeply increases from a right end, reaches a peak, and gradually decreases to reach a left end with a moderate change rate. As illustrated in FIG. 6, pupil division is executed moderately.

Figure 7:
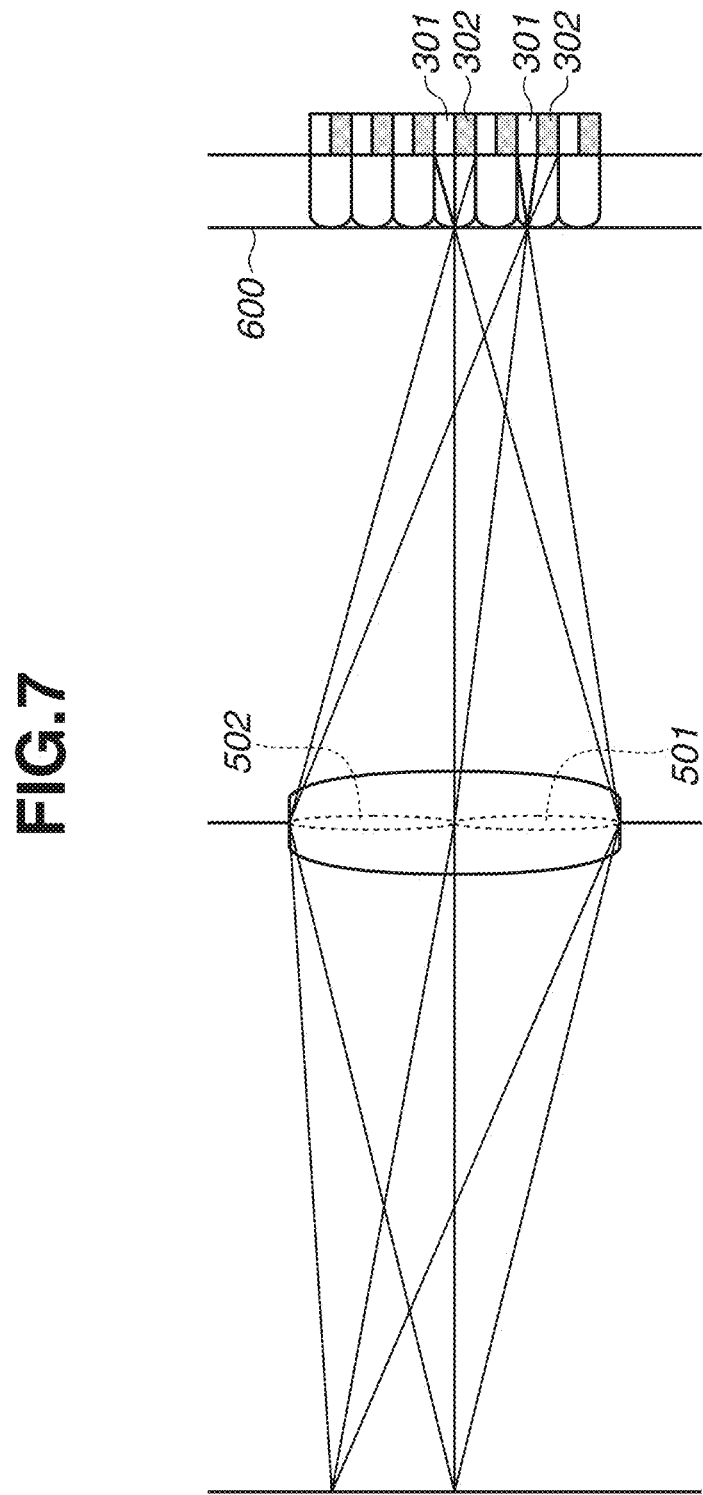
FIG. 7 is a diagram schematically illustrating an image sensor and pupil division according to the first exemplary embodiment of the present invention.

FIG. 7 is a diagram schematically illustrating a correspondence relationship between the image sensor and pupil division in the present exemplary embodiment. The first photoelectric conversion part 301 and the second photoelectric conversion part 302 (the first to the $N_{LF}$-th photoelectric conversion parts) correspond to the first sub-pixel 201 and the second sub-pixel 202 (the first to the $N_{LF}$-th sub-pixels) respectively. In each of the pixels of the image sensor, the first sub-pixel 201 and the second sub-pixel 202 obtained by dividing each pixel into 2×1 (the first to the $N_{LF}$-th sub-pixels obtained by dividing each pixel into Nx×Ny) respectively receive light fluxes passing through different pupil partial regions of the image-forming optical system, i.e., the first pupil partial region 501 and the second pupil partial region 502 (the first to the $N_{LF}$-th pupil partial regions). The LF data (input image) illustrating a spatial distribution and an angle distribution of light intensity is acquired from a signal received at each sub-pixel.

A captured image having resolution of a pixel count N can be generated from the LF data (input image) by combining all of the signals of the first sub-pixel 201 and the second sub-pixel 202 obtained by dividing each pixel into 2×1 (the first to the $N_{LF}$-th sub-pixels obtained by dividing each pixel into Nx×Ny) at each pixel.

Further, by selecting a signal of a specific sub-pixel from between the first sub-pixel 201 and the second sub-pixel 202 obtained by dividing each pixel into 2×1 (the first to the $N_{LF}$-th sub-pixels obtained by dividing each pixel into Nx×Ny), a viewpoint image corresponding to a specific pupil partial region from among the first pupil partial region 501 and the second pupil partial region 502 (the first to the $N_{LF}$-th pupil partial regions) of the image-forming optical system can be generated from the LF data (input image). For example, by selecting a signal of the first sub-pixel 201, a first viewpoint image having resolution of the pixel count N corresponding to the first pupil partial region 501 of the image-forming optical system can be generated at each pixel. The same can be also said for other sub-pixels.

As described above, the image sensor of the present exemplary embodiment has a configuration in which a plurality of pixels each having a plurality of photoelectric conversion parts for receiving light fluxes passing through different pupil partial regions of the image-forming optical system is arrayed, and the LF data (input image) can be acquired thereby.

An aperture stop of the first viewpoint image (the second viewpoint image) corresponds to the first pupil partial region 501 (the second pupil partial region 502), and an effective aperture value of the first viewpoint image (the second viewpoint image) is greater (darker) than an aperture value of the captured image. Therefore, if an image is captured at a same exposure time, the captured image has a large signal value because the captured image receives a relatively large amount of light from the object, whereas the first viewpoint image (the second viewpoint image) has a small signal value because the first viewpoint image (the second viewpoint image) receives a relatively small amount of light from the object. Accordingly, if the captured image is combined with the first viewpoint image (the second viewpoint image) at a higher ratio in a region where the object luminance is low and combined with the first viewpoint image (or the second viewpoint image) at a lower ratio in a region where the object luminance is high, an output image with an expanded dynamic range can be generated.

<Relationship Between Defocus Amount and Image Shift Amount>

A relationship between a defocus amount and an image shift amount of each of the first viewpoint image and the second viewpoint image (the first to the $N_{LF}$-th viewpoint images) generated from the LF data (input image) acquired by the image sensor of the present exemplary embodiment will be described below.

Figure 8:
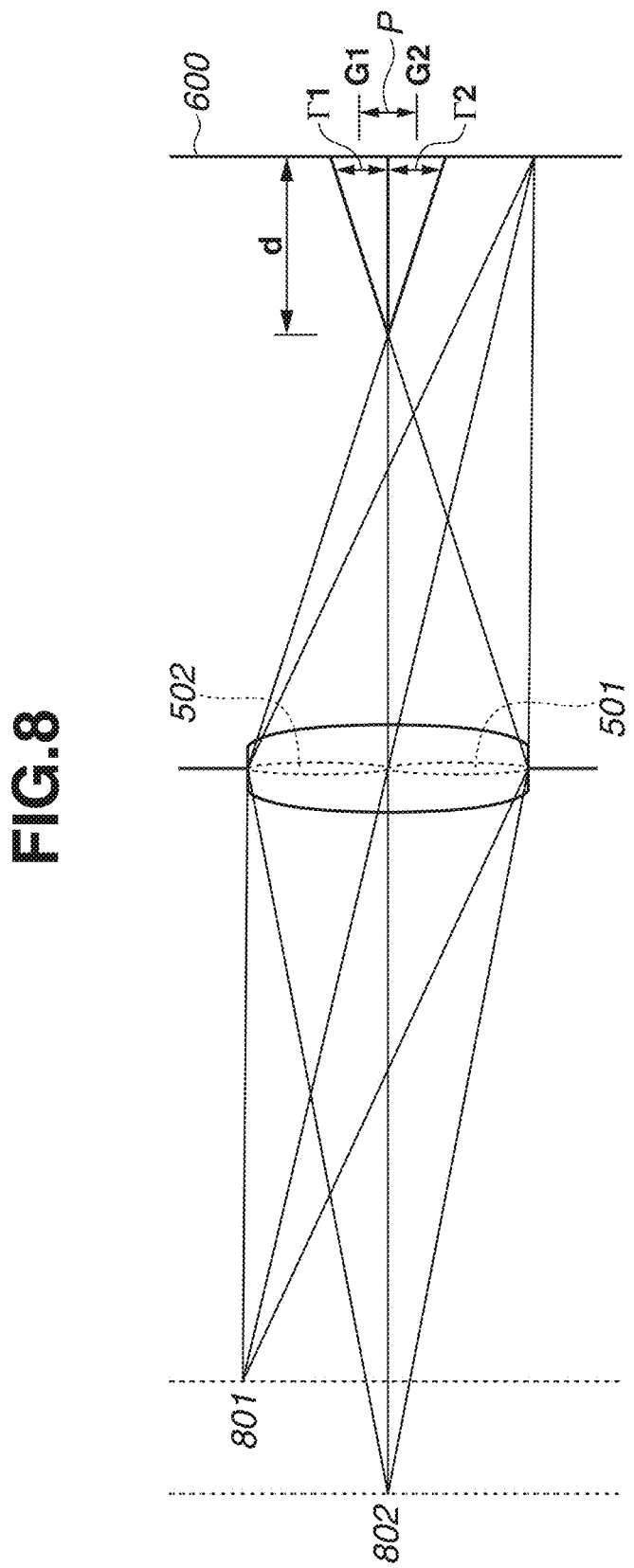
FIG. 8 is a diagram schematically illustrating a relationship between a defocus amount and an image shift amount of each of a first viewpoint image and a second viewpoint image according to the first exemplary embodiment of the present invention.

FIG. 8 is a diagram schematically illustrating a relationship between a defocus amount and an image shift amount of each of the first view point image and the second viewpoint image. The image sensor (not illustrated) is arranged on an imaging plane 600, and similar to the case illustrated in FIGS. 4 and 7, an exit pupil of the image-forming optical system is divided into 2×1 regions, i.e., the first pupil partial region 501 and the second pupil partial region 502.

A magnitude |d| of a defocus amount d represents a distance from an image-forming position of the object image to the imaging plane 600. A direction of the defocus amount d is expressed by a negative sign (d<0) with respect to a front-focus state in which an image-forming position of the object image is positioned on a side of the object than the imaging plane 600, and the direction thereof is expressed by a positive sign (d>0) with respect to a rear-focus state opposite to the front-focus state. The defocus amount d is 0 (d=0) in an in-focus state in which the image-forming position of the object image is positioned at the imaging plane (in-focus position). A position of an object 801 in FIG. 8 illustrates a position corresponding to the in-focus state (d=0m), and a position of an object 802 illustrates a position corresponding to a front-focus state (d<0). Hereinafter, the front-focus state (d<0) and the rear-focus state (d>0) are collectively referred to as a defocus state (|d|>0).

In the front-focus state (d<0), of the light fluxes from the object 802, a light flux passing through the first pupil partial region 501 (or the second pupil partial region 502) is collected once, and then dispersed by a width Γ1 (or Γ2) with a centroid position G1 (or G2) of the light flux being a center of dispersion. In this case, an image on the imaging plane 600 is blurred. This blurred image is received by the first sub-pixel 201 (or the second sub-pixel 202) constituting each of the pixels arrayed on the image sensor, and a first viewpoint image (or a second viewpoint image) is generated thereby. Thus, the first viewpoint image (or the second viewpoint image) is stored in a memory as image data of the object image (blurred image) having the width Γ1 (or Γ2) at the centroid position G1 (or G2) on the imaging plane 600. The width Γ1 (or Γ2) of the object image increases approximately in proportion to the increase of the magnitude |d| of the defocus amount d. Similarly, if an image shift amount of the object image between the first viewpoint image and the second viewpoint image is expressed as "p", a magnitude |p| of the image shift amount p increases in accordance with the increase of the magnitude |d| of the defocus amount d. For example, the image shift amount p is defined as a difference "G1-G2" of the centroid position of the light flux, and the magnitude |p| increases approximately in proportion to the increase of the magnitude |d|. Further, a similar tendency can be also seen in the rear-focus state (d>0) although an image shift direction of the object image between the first viewpoint image and the second view point image becomes opposite to that of the front-focus state.

Accordingly, in the present exemplary embodiment, the magnitude |p| of the image shift amount p between the first viewpoint image and the second viewpoint image increases in accordance with an increase in the defocus amounts d of the first viewpoint image and the second viewpoint image or the defocus amount d of the captured image in which the first and the second viewpoint images are added together.

<Correction Processing of Viewpoint Image Based on Captured Image>

In the present exemplary embodiment, an output image is generated by executing image processing such as defect correction or shading correction on the first viewpoint image and the second viewpoint image (the first to the $N_{LF}$-th viewpoint images) based on the captured image.

Hereinafter, with reference to FIG. 9 and FIGS. 10A, 10B, and 10C which schematically illustrate a flow of the correction processing, an image processing method for generating an output image by executing correction processing on the first viewpoint image and the second viewpoint image (the first to the $N_{LF}$-th viewpoint images) based on the captured image generated from the LF data (input image) acquired by the image sensor 107 of the present exemplary embodiment will be described. In addition, the processing illustrated in FIG. 9 and FIGS. 10A, 10B, and 10C is executed by the image sensor 107, the CPU 121, and the image processing circuit 125 serving as image processing units of the present exemplary embodiment.

<Captured Image and Viewpoint Image>

Figure 9:
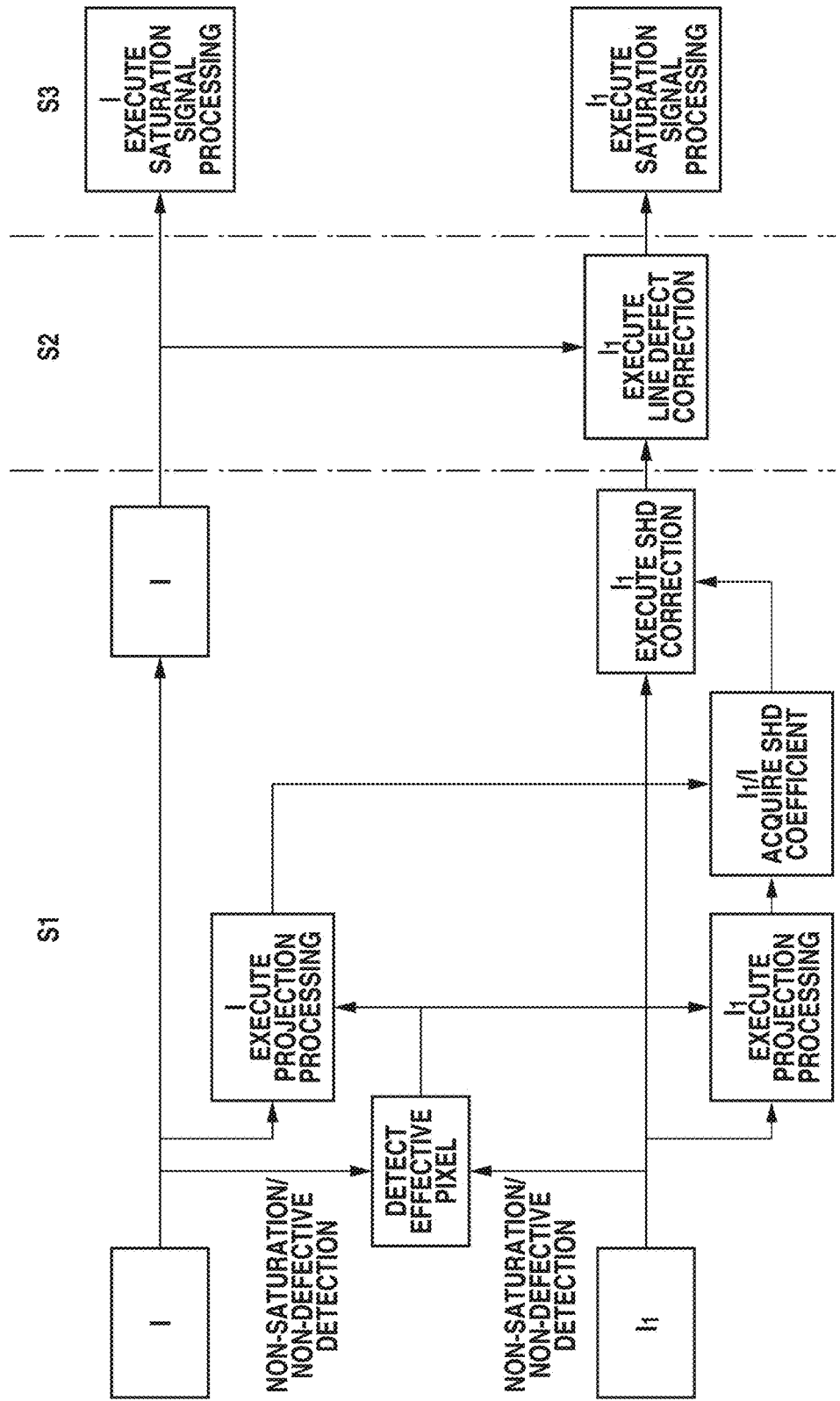
FIG. 9 is a flowchart illustrating an example of correction processing according to the first exemplary embodiment of the present invention.

First, in step S0 (not illustrated) as a prior step of step S1 in FIG. 9, a captured image corresponding to a pupil region in which different pupil partial regions of the image-forming optical system are combined and at least one viewpoint image corresponding to each of the different pupil partial regions of the image-forming optical system are generated from the LF data (input image) acquired by the image sensor 107 of the present exemplary embodiment.

First, in step S0, the LF data (input image) acquired by the image sensor 107 of the present exemplary embodiment is received. Alternatively, the LF data (input image) previously captured by the image sensor 107 of the present exemplary embodiment and stored in the storage medium may be used.

Next, in step S0, a captured image corresponding to the pupil region in which different pupil partial regions (the first and the second pupil partial regions) of the image-forming optical system are combined is generated. The LF data (input image) is expressed as "LF". Further, a sub-pixel signal at the is-th in the column direction ($1 \leq i_s \leq Nx$) and the $j_s$-th in the row direction ($1 \leq j_s \leq Ny$) in a pixel signal of the LF is referred to as the k-th sub-pixel signal, while a value "k" ($1 \leq k \leq N_{LF}$) is expressed as "k=Nx($j_s$−1)+$i_s$". A captured image I (j, i) at the i-th in the column direction and the j-th in the row direction, which corresponds to the pupil region in which different pupil partial regions of the image-forming optical system are combined, is generated by the formula 1.

<Formula 1>

$$I(j, i) = \sum_{j_S=1}^{N_y} \sum_{i_S=1}^{N_x} LF(N_y(j-1) + j_S, N_x(i-1) + i_S). \quad (1)$$

In the present exemplary embodiment, in order to favorably maintain a signal-to-noise (S/N) ratio of the captured image I (j, i), combination of sub-pixel signals expressed by the formula 1 is executed by the capacitance portion FD within the image sensor 107 before A/D conversion of the sub-pixel signal is executed. When the electric charge accumulated in the capacitance portion FD in the image sensor 107 is converted to a voltage signal, the combination of sub-pixel signals expressed by the formula 1 may be executed as appropriate before A/D conversion of the sub-pixel signals is executed. The combination of sub-pixel signals expressed by the formula 1 may be executed as appropriate after A/D conversion of the sub-pixel signals is executed.

In the present exemplary embodiment, a pixel is divided into two sub-pixels in the x-direction (Nx=2, Ny=1, and $N_{LF}$=2). From the input image (LF data) corresponding to the pixel array illustrated in FIG. 2, a captured image configured of a red-green-blue (RGB) signal in a Bayer array having a resolution of the pixel count N (N=horizontal pixel count $N_H$×vertical pixel count $N_V$) is generated by combining all of the signals of the first sub-pixel 201 and the second sub-pixel 202 each of which is obtained by dividing a pixel into two portions in the x-direction (the first to the $N_{LF}$-th sub-pixels obtained by dividing each pixel into Nx×Ny) at each of the pixels.

In the present exemplary embodiment, in order to use the captured image as a reference image for the correction processing of the viewpoint image, shading (light amount) correction processing or point defect correction processing is executed on the captured image I (j, i) for each color of RGB. Another processing may be executed as appropriate.

In step S0, the k-th viewpoint image $I_k$ (j, i) at the i-th position in the column direction and the j-th position in the row direction corresponding to the k-th pupil partial region of the image-forming optical system is generated by the formula 2.

$$I_k(j,i) = I_{N_x(i_S-1)+i_S}(j,i) = LF(N_y(j-1)+j_S, N_x(i-1)+i_S). \quad (2)$$

In the present exemplary embodiment, a pixel is divided into two sub-pixels in the x-direction (i.e., Nx=2, Ny=1, and $N_{LF}$=2), and a value "k" is selected as "1" (k=1). From the LF data (input image) corresponding to the pixel array illustrated in FIG. 2, a signal of the first sub-pixel 201 of a pixel divided into two portions in the x-direction is selected at each pixel. Therefore, a first viewpoint image $I_1$ (j, i) configured of the RGB signal in the Bayer array having a resolution of the pixel count N (N=horizontal pixel count $N_H$×vertical pixel count $N_V$), which corresponds to the first pupil partial region 501 from among the first pupil partial region 501 and the second pupil partial region 502 (the first to the $N_{LF}$-th pupil partial regions) of the image-forming optical system, is generated. A value "k" may be selected as "2" (k=2), so that a second viewpoint image $I_2$ (j, i) corresponding to the second pupil partial region 502 of the image-forming optical system is generated, as appropriate.

As described above, in the present exemplary embodiment, from the input image acquired by the image sensor in which a plurality of pixels each having a plurality of photoelectric conversion parts for receiving a light flux passing through the different pupil partial regions of the image-forming optical system is arrayed, a captured image corresponding to a pupil region in which different pupil partial regions are combined is generated, and at least one or more viewpoint images are generated at each of the different pupil partial regions.

In the present exemplary embodiment, the captured image I (j, i) configured of the RGB signal in the Bayer array and the first viewpoint image $I_1$ (j, i) configured of the RGB signal in the Bayer array are generated from the LF data (input image) acquired by the image sensor 107 of the present exemplary embodiment and stored in the storage medium. With this configuration, image processing similar to image processing executed on a captured image acquired by a conventional image sensor in which a photoelectric conversion part of each pixel is not divided can be executed on the captured image I (j, i) of the present exemplary embodiment.

<Shading (Light Amount) Correction of Viewpoint Image>

In step S1 of FIG. 9, based on the captured image I (j, i) of the present exemplary embodiment, shading (light amount) correction is executed on the first viewpoint image $I_1$ (the k-th viewpoint image $I_k$) for each color of RGB.

Herein, shading caused by a pupil shift between the first viewpoint image and the second viewpoint image (the first to the $N_{LF}$-th viewpoint images) will be described. FIGS. 10A to 10C are diagrams illustrating a relationship between the first pupil partial region 501 through which light is received by the first photoelectric conversion part 301, the second pupil partial region 502 through which light is received by the second photoelectric conversion part 302, and the exit pupil 400 of the image-forming optical system at the peripheral image height of the image sensor 107. The same reference numerals are applied to the elements the same as those illustrated in FIG. 4. The first photoelectric conversion part 301 and the second photoelectric conversion part 302 (the first to the $N_{LF}$-th photoelectric conversion parts) respectively correspond to the first sub-pixel 201 and the second sub-pixel 202 (the first to the $N_{LF}$-th sub-pixels).

FIG. 10A illustrates a state where an exit pupil distance D1 of the image-forming optical system is equal to a set pupil distance Ds of the image sensor 107. In this case, the exit pupil 400 of the image-forming optical system is divided almost equally by the first pupil partial region 501 and the second pupil partial region 502. On the contrary, as illustrated in FIG. 10B, if the exit pupil distance D1 of the image-forming optical system is shorter than the set pupil distance Ds of the image sensor 107, a pupil shift occurs between the exit pupil of the image-forming optical system and the incident pupil of the image sensor 107 at the peripheral image height of the image sensor 107, so that the exit pupil 400 of the image-forming optical system is divided unequally. Similarly, as illustrated in FIG. 10C, if the exit pupil distance D1 of the image-forming optical system is longer than the set pupil distance Ds of the image sensor 107, a pupil shift also occurs between the exit pupil of the image-forming optical system and the incident pupil of the image sensor 107 at the peripheral image height of the image sensor 107, and thus the exit pupil 400 of the image-forming optical system is divided unequally. Intensity of the first and the second viewpoint images also becomes unequal if the pupil is divided unequally at the peripheral image height, and thus shading in which intensity of one viewpoint image of the first and the second viewpoint images is increased while the intensity of another viewpoint image is decreased occurs at each color of RGB.

In the present exemplary embodiment, in step S1 of FIG. 9, in order to generate a viewpoint image of favorable image quality, shading (light amount) correction is executed on the first viewpoint image $I_1$ (the k-th viewpoint image $I_k$) for each color of RGB by making the captured image I (j, i) as a reference image.

First, in step S1 in FIG. 9, an effective pixel $V_1$ (j, i) in which both of the captured image I (j, i) and the first viewpoint image $I_1$ (j, i) are non-saturated and non-defective is detected. An effective pixel in which both of the captured image I (j, i) and the first viewpoint image $I_1$ (j, i) are non-saturated and non-defective is expressed as $V_1$ (j, i)=1. On the other hand, a non-effective pixel in which any one of the captured image I (j, i) and the first viewpoint image $I_1$ (j, i) is saturated or defective is expressed as $V_1$ (j, i)=0. Similarly, in shading (light amount) correction of the k-th viewpoint image $I_k$, an effective pixel in which both of the captured image I (j, i) and the k-th viewpoint image $I_k$ (j, i) are non-saturated as well as non-defective is expressed as "$V_k$ (j, i)".

If the captured image I (j, i) satisfies the condition I (j, i)>IS, where a saturation determination threshold value of an imaging signal is "IS", the captured image I (j, i) is determined to be saturated. If the captured image I (j, i) satisfies the condition I (j, i)≤IS, the captured image I (j, i) is determined to be non-saturated. Similarly, if the k-th viewpoint image $I_k$ (j, i) satisfies the condition $I_k$ (j, i)>$IS_k$, where a saturation determination threshold value of the k-th viewpoint image is "$IS_k$", the k-th viewpoint image $I_k$ (j, i) is determined to be saturated. If the k-th viewpoint image $I_k$ (j, i) satisfies the condition $I_k$ (j, i)≤$IS_k$, the k-th viewpoint image $I_k$ (j, i) is determined to be non-saturated. The saturation determination threshold value $IS_k$ of the k-th viewpoint image is the saturation determination threshold value IS of the imaging signal or less ($IS_k$≤IS).

In the image sensor 107 of the present exemplary embodiment, if accumulated electric charge is saturated in any one of the first photoelectric conversion part 301 and the second photoelectric conversion part 302 (the first to the $N_{LF}$-th photoelectric conversion parts) of the pixel, the electric charge leaks into another photoelectric conversion part (sub-pixel) within the same pixel (crosstalk of electric charge) instead of leaking out of the pixel. If any one of the sub-pixels (e.g., second sub-pixel) is saturated and crosstalk of electric charge occurs between the sub-pixels (e.g., from the second sub-pixel to the first sub-pixel), a linear relationship of the accumulated electric charge amount with respect to the incident light amount cannot be maintained in both of the electric charge leakage source sub-pixel (e.g., second sub-pixel) and the electric charge leakage destination sub-pixel (e.g., first sub-pixel), and thus information necessary for correctly detecting shading can no longer be included therein.

The crosstalk of electric charge is likely to occur in low sensitivity (i.e., International Organization for Standardization (ISO) sensitivity) than in high ISO sensitivity because an amount of electric charge accumulated in the photoelectric conversion part is relatively greater in low ISO sensitivity. Accordingly, in the present exemplary embodiment, in order to improve detection precision of the saturated pixel, the saturation determination threshold value IS of the imaging signal in low ISO sensitivity may desirably be equal to or less than the saturation determination threshold value IS of the imaging signal in high ISO sensitivity. Further, the saturation determination threshold value $IS_k$ of the k-th viewpoint image in low ISO sensitivity may desirably be equal to or less than the saturation determination threshold value $IS_k$ of the k-th viewpoint image in high ISO sensitivity.

Further, if the exit pupil distance D1 of the image-forming optical system is shorter than a first predetermined pupil distance (or longer than a second predetermined pupil distance), shading caused by a pupil shift between the exit pupil of the image-forming optical system and the incident pupil of the image sensor 107 occurs, and intensity of one viewpoint image from among the first and the second viewpoint images is increased while intensity of another viewpoint image is decreased at the peripheral image height thereof. In such a case, crosstalk of electric charge is likely to occur. Accordingly, in the present exemplary embodiment, in order to improve detection precision of the saturated pixel, the saturation determination threshold value IS of the imaging signal which is used when the exit pupil distance D1 of the image-forming optical system is shorter than the first predetermined pupil distance or longer than the second predetermined pupil distance may desirably be equal to or less than the saturation determination threshold value IS of the imaging signal which is used when the exit pupil distance D1 of the image-forming optical system is the first predetermined pupil distance or more and the second predetermined pupil distance or less. Further, the saturation determination threshold value $IS_k$ of the k-th viewpoint image which is used when the exit pupil distance D1 of the image-forming optical system is shorter than the first predetermined pupil distance or longer than the second predetermined pupil distance may desirably be equal to or less than the saturation determination threshold value $IS_k$ of the k-th viewpoint image which is used when the exit pupil distance D1 of the image-forming optical system is the first predetermined pupil distance or more and the second predetermined pupil distance or less.

It is assumed that an integer $j_2$ satisfies the condition $1 \le j_2 \le N_V/2$, and an integer $i_2$ satisfies the condition $1 \le i_2 \le N_H/2$. The captured images I in respective components of R, Gr, Gb, and B arranged in the Bayer array illustrated in FIG. 2 are referred to as captured images RI, GrI, GbI, and BI, and respectively defined as RI $(2j_2-1, 2i_2-1)$=I $(2j_2-1, 2i_2-1)$, GrI $(2j_2-1, 2i_2)$=I $(2j_2-1, 2i_2)$, GbI $(2j_2, 2i_2-1)$=I $(2j_2, 2i_2-1)$, and BI $(2j_2, 2i_2)$=I $(2j_2, 2i_2)$.

Similarly, the k-th viewpoint images $I_k$ in respective components of R, Gr, Gb, and B arranged in the Bayer array illustrated in FIG. 2 are referred to as the k-th viewpoint images $RI_k$, $GrI_k$, $GbI_k$, and $BI_k$, and respectively defined as $RI_k$ $(2j_2-1, 2i_2-1)$=$I_k$ $(2j_2-1, 2i_2-1)$, $GrI_k$ $(2j_2-1, 2i_2)$=$I_k$ $(2j_2-1, 2i_2)$, $GbI_k$ $(2j_2, 2i_2-1)$=$I_k$ $(2j_2, 2i_2-1)$, and $BI_k$ $(2j_2, 2i_2)$=$I_k$ $(2j_2, 2i_2)$.

In step S1 in FIG. 9, by executing projection processing of the captured images RI $(2j_2-1, 2i_2-1)$, GrI $(2j_2-1, 2i_2)$, GbI $(2j_2, 2i_2-1)$, and BI $(2j_2, 2i_2)$ in a direction (y-direction) orthogonal to the pupil division direction (x-direction) using the formulas 3A to 3D, projection signals RP $(2i_2-1)$, GrP $(2i_2)$, GbP $(2i_2-1)$, and BP $(2i_2)$ of the captured images are generated. Information for correctly detecting shading for each color of RGB of the captured image is not included in a saturation signal value or a defective signal value. Therefore, projection processing is executed by taking a product of the captured image and the effective pixel $V_k$ and eliminating the saturation signal value or the defective signal value (a numerator in the upper stage of each of the formulas 3A to 3D), and normalization is executed by the effective pixel count used for the projection processing (a denominator in the upper stage of each of the formulas 3A to 3D). If the effective pixel count used for the projection processing is 0, a projection signal of the captured image is set to 0 using the lower stage of each of the formulas 3A to 3D. Further, if the projection signal of the captured image becomes a negative signal due to the influence of noise, the projection signal of the captured image is set to 0. Similarly, by executing the projection processing of the k-th viewpoint images $RI_k$ $(2j_2-1, 2i_2-1)$, $GrI_k$ $(2j_2-1, 2i_2)$, $GbI_k$ $(2j_2, 2i_2-1)$, and $BI_k$ $(2j_2, 2i_2)$ in a direction (y-direction) orthogonal to the pupil division direction (x-direction) using the formulas 3E to 3H, projection signals $RP_k$ $(2i_2-1)$, $GrP_k$ $(2i_2)$, $GbP_k$ $(2i_2-1)$, and $BP_k$ $(2i_2)$ of the k-th viewpoint images are generated.

<Formula 3A>

$$RP(2i_2-1) = \begin{cases} \dfrac{\sum_{j_2=1}^{N_V/2} RI(2j_2-1, 2i_2-1) \times V_k(2j_2-1, 2i_2-1)}{\sum_{j_2=1}^{N_V/2} V_k(2j_2-1, 2i_2-1)}, & \sum_{j_2=1}^{N_V/2} V_k(2j_2-1, 2i_2-1) \neq 0 \\ 0, & \sum_{j_2=1}^{N_V/2} V_k(2j_2-1, 2i_2-1) = 0, \end{cases}$$

<Formula 3B>

$$G_rP(2i_2) = \begin{cases} \dfrac{\sum_{j_2=1}^{N_V/2} G_rI(2j_2-1, 2i_2) \times V_k(2j_2-1, 2i_2)}{\sum_{j_2=1}^{N_V/2} V_k(2j_2-1, 2i_2)}, & \sum_{j_2=1}^{N_V/2} V_k(2j_2-1, 2i_2) \neq 0 \\ 0, & \sum_{j_2=1}^{N_V/2} V_k(2j_2-1, 2i_2) = 0, \end{cases}$$

<Formula 3C>

$$G_bP(2i_2-1) = \begin{cases} \dfrac{\sum_{j_2=1}^{N_V/2} G_bI(2j_2, 2i_2-1) \times V_k(2j_2, 2i_2-1)}{\sum_{j_2=1}^{N_V/2} V_k(2j_2, 2i_2-1)}, & \sum_{j_2=1}^{N_V/2} V_k(2j_2, 2i_2-1) \neq 0 \\ 0, & \sum_{j_2=1}^{N_V/2} V_k(2j_2, 2i_2-1) = 0, \end{cases}$$

<Formula 3D>

$$BP(2i_2) = \begin{cases} \dfrac{\sum_{j_2=1}^{N_V/2} BI(2j_2, 2i_2) \times V_k(2j_2, 2i_2)}{\sum_{j_2=1}^{N_V/2} V_k(2j_2, 2i_2)}, & \sum_{j_2=1}^{N_V/2} V_k(2j_2, 2i_2) \neq 0 \\ 0, & \sum_{j_2=1}^{N_V/2} V_k(2j_2, 2i_2) = 0, \end{cases}$$

<Formula 3E>

$$RP_k(2i_2-1) = \begin{cases} \dfrac{\sum_{j_2=1}^{N_V/2} RI_k(2j_2-1, 2i_2-1) \times V_k(2j_2-1, 2i_2-1)}{\sum_{j_2=1}^{N_V/2} V_k(2j_2-1, 2i_2-1)}, & \sum_{j_2=1}^{N_V/2} V_k(2j_2-1, 2i_2-1) \neq 0 \\ 0, & \sum_{j_2=1}^{N_V/2} V_k(2j_2-1, 2i_2-1) = 0, \end{cases}$$

<Formula 3F>

$$G_rP_k(2i_2) = \begin{cases} \dfrac{\sum_{j_2=1}^{N_V/2} G_rI_k(2j_2-1, 2i_2) \times V_k(2j_2-1, 2i_2)}{\sum_{j_2=1}^{N_V/2} V_k(2j_2-1, 2i_2)}, & \sum_{j_2=1}^{N_V/2} V_k(2j_2-1, 2i_2) \neq 0 \\ 0, & \sum_{j_2=1}^{N_V/2} V_k(2j_2-1, 2i_2) = 0, \end{cases}$$

<Formula 3G>

$$G_bP_k(2i_2-1) = \begin{cases} \dfrac{\sum_{j_2=1}^{N_V/2} G_bI_k(2j_2, 2i_2-1) \times V_k(2j_2, 2i_2-1)}{\sum_{j_2=1}^{N_V/2} V_k(2j_2, 2i_2-1)}, & \sum_{j_2=1}^{N_V/2} V_k(2j_2, 2i_2-1) \neq 0 \\ 0, & \sum_{j_2=1}^{N_V/2} V_k(2j_2, 2i_2-1) = 0, \end{cases}$$

<Formula 3H>

$$BP_k(2i_2) = \begin{cases} \dfrac{\sum_{j_2=1}^{N_V/2} BI_k(2j_2, 2i_2) \times V_k(2j_2, 2i_2)}{\sum_{j_2=1}^{N_V/2} V_k(2j_2, 2i_2)}, & \sum_{j_2=1}^{N_V/2} V_k(2j_2, 2i_2) \neq 0 \\ 0, & \sum_{j_2=1}^{N_V/2} V_k(2j_2, 2i_2) = 0. \end{cases}$$

After the projection processing is executed using the formulas 3A to 3H, low-pass filter processing for smoothing the projection signals RP ($2i_2-1$), GrP ($2i_2$), GbP ($2i_2-1$), and BP ($2i_2$) of the captured image and the projection signals $RP_k$ ($2i_2-1$), $GrP_k$ ($2i_2$), $GbP_k$ ($2i_2-1$), and $BP_k$ ($2i_2$) of the k-th viewpoint images is executed. This processing may be omitted as appropriate.

Figure 11A:
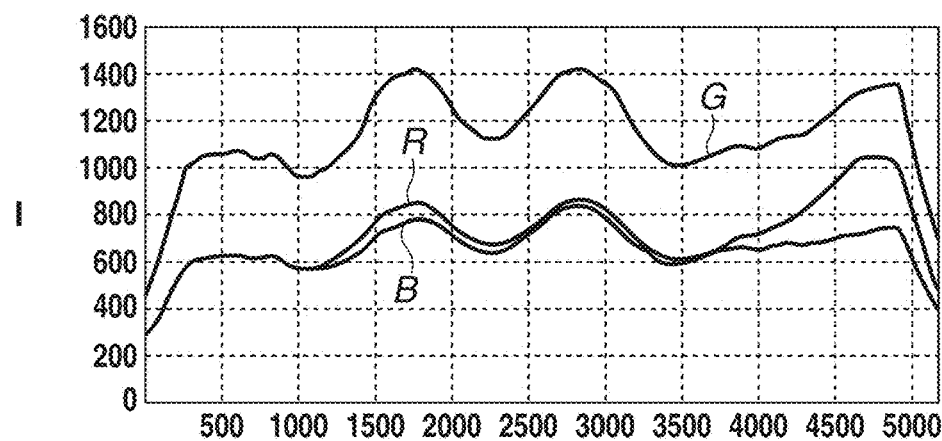
FIGS. 11A, 11B, and 11C are graphs respectively illustrating a projection signal of a captured image, a projection signal of a viewpoint image, and a shading curve according to the first exemplary embodiment of the present invention.
Figure 11B:
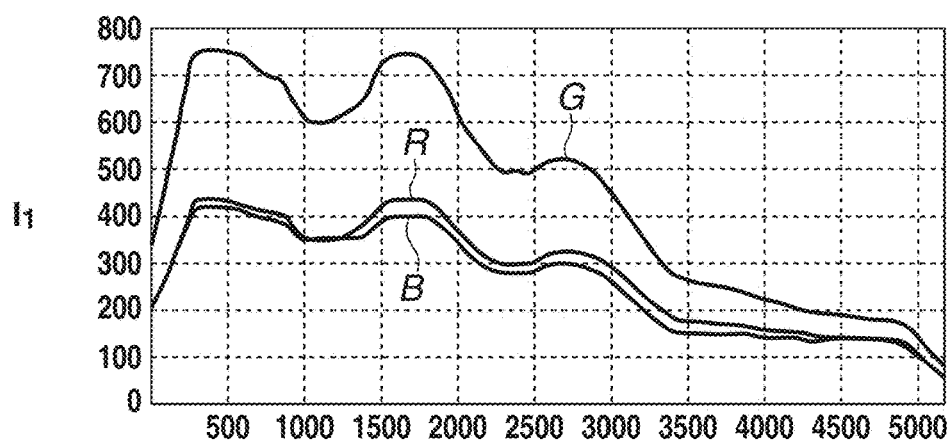

FIG. 11A is a graph illustrating examples of projection signals RP (R), GrP (G), GbP (G), and BP (B) of the captured image, and FIG. 11B is a graph illustrating examples of projection signals $RP_1$ (R), $GrP_1$ (G), $GbP_1$ (G), and $BP_1$ (B) of the first viewpoint image. Each of the projection signals rises and falls to form a plurality of peaks and troughs dependent on the object. In order to execute shading (light amount) correction on the first viewpoint image $I_1$ (the k-th viewpoint image $I_k$) with high precision, shading components of each color of RGB of the first viewpoint image $I_1$ (the k-th viewpoint image $I_k$) caused by the pupil shift and signal components of each color of RGB included in the object need to be separated.

In step S1, relative shading signals $RS_k$ ($2i_2-1$), $GrS_k$ ($2i_2$), $GbS_k$ ($2i_2-1$), and $BS_k$ ($2i_2$) of each color of RGB of the k-th viewpoint image $I_k$ are calculated using the formulas 4A to 4D which taking the captured image as a reference.

A light receiving amount of the pixel is greater than a light receiving amount of the sub-pixel, and the light-receiving amount of the sub-pixel has to be greater than 0 in order to calculate the shading component. Therefore, if the conditional expression RP ($2i_2-1$)>$RP_k$ ($2i_2-1$)>0 is satisfied, a shading signal $RS_k$ ($2i_2-1$) of the k-th viewpoint image $RI_k$ is generated by acquiring a ratio of the projection signal $RP_k$ $(2i_2-1)$ of the k-th viewpoint image $RI_k$ and the projection signal $RP$ $(2i_2-1)$ of the captured image $RI$ and multiplying and normalizing the ratio by the pupil division number $N_{LF}$ using the formula 4A. With this processing, a signal component of R included in the object is offset, so that a shading component of R of the k-th viewpoint image $I_k$ can be separated. On the other hand, if the conditional expression $RP$ $(2i_2-1) > RP_k$ $(2i_2-1) > 0$ is not satisfied, a shading signal $RS_k$ $(2i_2-1)$ of the k-th viewpoint image $RI_k$ is set to 0.

Similarly, if the conditional expression $GrP$ $(2i_2) > GrP_k$ $(2i_2) > 0$ is satisfied, a shading signal $GrS_k$ $(2i_2)$ of the k-th viewpoint image $GrI_k$ is generated by acquiring a ratio of the projection signal $GrP_k$ $(2i_2)$ of the k-th viewpoint image $GrI_k$ and the projection signal $GrP$ $(2i_2)$ of the captured image $GrI$ and multiplying and normalizing the ratio by the pupil division number $N_{LF}$ using the formula 4B. With this processing, a signal component of Gr included in the object is offset, so that a shading component of Gr of the k-th viewpoint image $I_k$ can be separated. On the other hand, if the conditional expression $GrP$ $(2i_2) > GrP_k$ $(2i_2) > 0$ is not satisfied, a shading signal $GrS_k$ $(2i_2)$ of the k-th viewpoint image $GrI_k$ is set to 0.

Similarly, if the conditional expression $GbP$ $(2i_2-1) > GbP_k$ $(2i_2-1) > 0$ is satisfied, a shading signal $GbS_k$ $(2i_2-1)$ of the k-th viewpoint image $GbI_k$ is generated by acquiring a ratio of the projection signal $GbP_k$ $(2i_2-1)$ of the k-th viewpoint image $GbI_k$ and the projection signal $GbP$ $(2i_2-1)$ of the captured image $GbI$ and multiplying and normalizing the ratio by the pupil division number $N_{LF}$ using the formula 4C. With this processing, a signal component of Gb included in the object is offset, so that a shading component of Gb of the k-th viewpoint image $I_k$ can be separated. On the other hand, if the conditional expression $GbP$ $(2i_2-1) > GbP_k$ $(2i_2-1) > 0$ is not satisfied, a shading signal $GbS_k$ $(2i_2-1)$ of the k-th viewpoint image $GbI_k$ is set to 0.

Similarly, if the conditional expression $BP$ $(2i_2) > BP_k$ $(2i_2) > 0$ is satisfied, a shading signal $BS_k$ $(2i_2)$ of the k-th viewpoint image $BI_k$ is generated by acquiring a ratio of the projection signal $BP_k$ $(2i_2)$ of the k-th viewpoint image $BI_k$ and the projection signal $BP$ $(2i_2)$ of the captured image $BI$ and multiplying and normalizing the ratio by the pupil division number $N_{LF}$ using the formula 4D. With this processing, a signal component of B included in the object is offset, so that a shading component of B of the k-th viewpoint image $I_k$ can be separated. On the other hand, if the conditional expression $BP$ $(2i_2) > BP_k$ $(2i_2) > 0$ is not satisfied, a shading signal $BS_k$ $(2i_2)$ of the k-th viewpoint image $BI_k$ is set to 0.

<Formula 4A>

$$RS_k(2i_2 - 1) = \begin{cases} \dfrac{N_{LF} \times RP_k(2i_2 - 1)}{RP(2i_2 - 1)}, & RP(2i_2 - 1) > RP_k(2i_2 - 1) > 0, \\ 0, & \text{otherwise}, \end{cases}$$

<Formula 4B>

$$G_rS_k(2i_2 - 1) = \begin{cases} \dfrac{N_{LF} \times G_rP_k(2i_2)}{G_rP(2i_2)}, & G_rP(2i_2) > G_rP_k(2i_2) > 0, \\ 0, & \text{otherwise}, \end{cases}$$

<Formula 4C>

$$G_bS_k(2i_2 - 1) = \begin{cases} \dfrac{N_{LF} \times G_bP_k(2i_2 - 1)}{G_bP(2i_2 - 1)}, & G_bP(2i_2 - 1) > G_bP_k(2i_2 - 1) > 0, \\ 0, & \text{otherwise}, \end{cases}$$

<Formula 4D>

$$BS_k(2i_2 - 1) = \begin{cases} \dfrac{N_{LF} \times BP_k(2i_2)}{BP(2i_2)}, & BP(2i_2) > BP_k(2i_2) > 0, \\ 0, & \text{otherwise}. \end{cases}$$

In order to execute shading correction with high precision, shading correction may desirably be executed if effective shading signal count which satisfies the conditional expressions $RS_k$ $(2i_2-1) > 0$, $GrS_k$ $(2i_2) > 0$, $GbS_k$ $(2i_2-1) > 0$, and $BS_k$ $(2i_2) > 0$, is a predetermined value or more.

In step S1, using the formulas 5A to 5D, shading functions $RSF_k(2i_2-1)$, $GrSF_k$ $(2i_2)$, $GbSF_k$ $(2i_2-1)$, or $BSF_k$ $(2i_2)$ of each color of RGB of the k-th viewpoint image $I_k$ are represented as a smooth polynomial function of degree $N_{SF}$ with respect to a positional variable in the pupil division direction (x-direction). Further, an effective shading signal generated by each of the formulas 4A to 4D, which satisfies the conditional expression $RS_k$ $(2i_2-1) > 0$, $GrS_k$ $(2i_2) > 0$, $GbS_k$ $(2i_2-1) > 0$, or $BS_k$ $(2i_2) > 0$, is set as a data point.

By using the data point, parameter fitting is executed through a least-square method, and coefficients $RSC_k$ $(\mu)$, $GrSC_k$ $(\mu, GbSC_k$ $(\mu)$, and $BSC_k$ $(\mu)$ are calculated using the formulas 5A to 5D. Through the above-described processing, shading functions $RSF_k$ $(2i_2-1)$, $GrSF_k$ $(2i_2)$, $GbSF_k$ $(2i_2-1)$, and $BSFk$ $(2i_2)$ of each color of RGB of the k-th viewpoint image $I_k$ relative to the captured image are generated.

<Formula 5A>

$$RSF_k(2i_2 - 1) = \sum_{\mu=0}^{N_{SF}} RSC_k(\mu) \times (2i_2 - 1)^\mu,$$

<Formula 5B>

$$G_rSF_k(2i_2) = \sum_{\mu=0}^{N_{SF}} G_rSC_k(\mu) \times (2i_2)^\mu,$$

<Formula 5C>

$$G_bSF_k(2i_2 - 1) = \sum_{\mu=0}^{N_{SF}} G_bSC_k(\mu) \times (2i_2 - 1)^\mu,$$

<Formula 5D>

$$BSF_k(2i_2) = \sum_{\mu=0}^{N_{SF}} BSC_k(\mu) \times (2i_2)^\mu.$$

Functions acquired by reversing the shading functions $RSF_k$, $GrSF_k$, $GbSF_k$, and $BSF_k$ in the pupil division direction (x-direction) are respectively expressed as R [$RSF_k$], R [$GrSF_k$], R [$GbSF_k$], and R [$BSF_k$]. If each of conditional expressions $1-\varepsilon \leq RSF_k + R[RSF_k] \leq 1+\varepsilon$, $1-\varepsilon \leq GrSF_k + R[GrSF_k] \leq 1+\varepsilon$, $1-\varepsilon \leq GbSF_k + R[GbSF_k]1 + 249$, and $1-\varepsilon \leq BSF_k + R[BSF_k] \leq 1+\varepsilon$, is fully satisfied at each of positions when a predetermined permissible value $\varepsilon$ satisfies the condition $0 < \varepsilon < 1$, a detected shading function is determined to be appropriate, and the processing is executed using each of the formulas 6A to 6D. Otherwise, the detected shading function is determined to be inappropriate and set as $RSF_k=1$, $GrSF_k=1$, $GbSF_k=1$, or $BSF_{k=1}$, and exception processing is executed as appropriate.

Figure 11C:
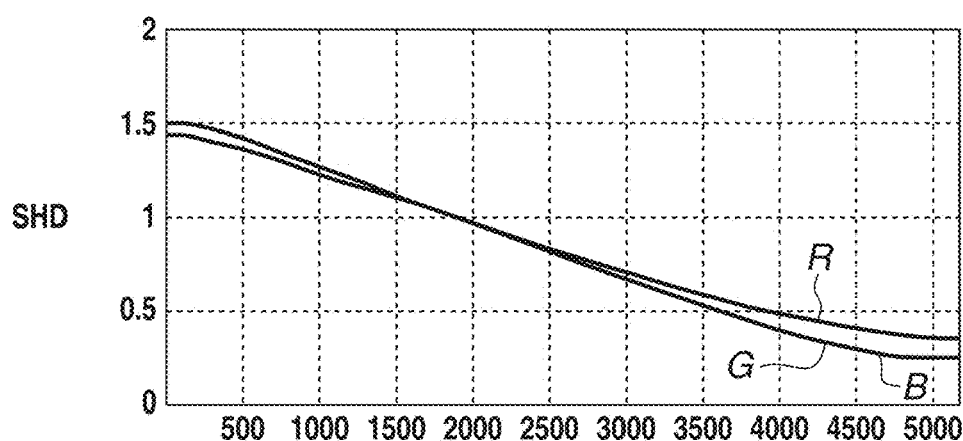

FIG. 11C is a graph illustrating examples of shading functions $RSF_1$ (R), $GrSF_1$ (G), $GbSF_1$ (G), and $BSF_1$ (B) of the respective colors of RGB of the first viewpoint image $I_1$ relative to the captured image. The projection signals of the first viewpoint image in FIG. 11B and the captured image in FIG. 11A rise and fall to form a plurality of peaks and troughs dependent on the object. On the contrary, by acquiring a ratio of the projection signal of the first viewpoint image and the projection signal of the captured image, peaks and troughs that rise and fall dependent on the object (signal values of each color of RGB included in the object) can be offset, so that smooth shading functions of each color of RGB of the first viewpoint image $I_1$ can be separately generated.

In the present exemplary embodiment, a polynomial function is used as a shading function. However, the exemplary embodiment is not limited thereto, and a more general function may be used as appropriate according to a shading shape.

In step S1 in FIG. 9, shading (light amount) correction processing is executed on the k-th viewpoint image $I_k$ (j, i) using the formulas 6A to 6D by using the shading functions for each color of the RGB, and a k-th viewpoint (first corrected) image $M_1I_k$ (j, i) after shading correction is generated. Herein, the k-th viewpoint (first corrected) images $M_1I_k$ in the respective R, Gr, Gb, and B arranged in the Bayer array are referred to as the k-th viewpoint (first corrected) images $RM_1I_k$, $GrM_1I_k$, $GbM_1I_k$, and $BM_1I_k$, and respectively defined as $RM_1I_k$ $(2j_2-1, 2i_2-1)$=$M_1I_k$ $(2j_2-1, 2i_2-1)$, $GrM_1I_k$ $(2j_2-1, 2i_2)$=$M_1I_k$ $(2j_2-1, 2i_2)$, $GbM_1I_k$ $(2j_2, 2i_2-1)$=$M_1I_k$ $(2j_2, 2i_2-1)$, and $BM_1I_k$ $(2j_2, 2i_2)$=$M_1I_k$ $(2j_2, 2i_2)$. The k-th viewpoint image (first corrected) $M_1I_k$ (j, i) after shading correction may be specified as an output image as appropriate.

<Formula 6A>

$$RM_1I_k(2j_2-1, 2i_2-1) = \frac{RI_k(2j_2-1, 2i_2-1)}{RSF_k(2i_2-1)},$$

<Formula 6B>

$$G_rM_1I_k(2j_2-1, 2i_2) = \frac{G_rI_k(2j_2-1, 2i_2)}{G_rSF_k(2i_2)},$$

<Formula 6C>

$$G_bM_1I_k(2j_2, 2i_2-1) = \frac{G_bI_k(2j_2, 2i_2-1)}{G_bSF_k(2i_2-1)},$$

<Formula 6D>

$$BM_1I_k(2j_2, 2i_2) = \frac{BI_k(2j_2, 2i_2)}{BSF_k(2i_2-1)},$$

In the present exemplary embodiment, based on the captured image and the viewpoint image, shading functions of for each color of RGB are calculated by offsetting a signal variation caused by an object in the captured image and a signal variation caused by an object in the viewpoint image. Then, shading correction amounts (light amount correction amounts) for each color of RGB are calculated by taking an inverse of the shading functions. Based on the calculated shading correction amount (light amount correction amount), shading (light amount) correction processing of the viewpoint image is executed.

Figure 12:
FIG. 12 is a diagram illustrating an example of a captured image according to the first exemplary embodiment of the present invention.
Figure 13:
FIG. 13 is a diagram illustrating an example of a first viewpoint image before shading correction according to the first exemplary embodiment of the present invention.
Figure 14:
FIG. 14 is a diagram illustrating an example of a first viewpoint image after shading correction according to the first exemplary embodiment of the present invention.

Hereinafter, effect of shading (light amount) correction processing in step S1 in FIG. 9 of the present exemplary embodiment, executed for each color of RGB of the first viewpoint image $I_1$ (j, i), will be described with reference to FIGS. 12 to 14. FIG. 12 is a diagram illustrating an example of the captured image I (after de-mosaicing) of the present exemplary embodiment. This is an example of the captured image of favorable image quality. FIG. 13 is a diagram illustrating an example of the first viewpoint image $I_1$ (after de-mosaicing) before shading correction of the present exemplary embodiment. In this example, shading occurs in each color of RGB due to a pupil shift between the exit pupil of the image-forming optical system and the incident pupil of the image sensor 107, and as a result, the luminance level is lowered and the RGB ratio is modulated in a right side region of the first viewpoint image $I_1$ (j, i). FIG. 14 is a diagram illustrating an example of the first viewpoint (first corrected) image $M_1I_1$ (after de-mosaicing) of the present exemplary embodiment after shading correction. Lowering of the luminance level and the modulation of the RGB ratio are corrected through the shading correction of each color of RGB based on the captured image. Therefore, similar to the case of the captured image, the first viewpoint (first corrected) image $M_1I_1$ (j, i) of favorable image quality after shading correction is generated.

In the present exemplary embodiment, from the input image acquired by the image sensor in which a plurality of pixels each having a plurality of photoelectric conversion parts for receiving a light flux passing through the different pupil partial regions of the image-forming optical system is arrayed, a captured image corresponding to a pupil region in which different pupil partial regions are combined is generated, and a plurality of viewpoint images is generated at each of the different pupil partial regions. Then, based on the captured image and the viewpoint image, a light amount correction amount of the viewpoint image is calculated by offsetting a signal variation caused by the object in the captured image and a signal variation caused by the object in the viewpoint image, and based on the light amount correction amount, light amount correction processing is executed on the viewpoint image, so that an output image is generated.

In the present exemplary embodiment, an effective pixel in which signals of both of the captured image and the viewpoint image are effective is detected, and light amount correction processing of the viewpoint image is executed based on the signals of the captured image and the viewpoint image of the effective pixels. In the present exemplary embodiment, the effective pixels are non-saturated as well as non-defective.

In the present exemplary embodiment, light amount (shading) correction processing of the respective colors (RGB) of the viewpoint image is executed based on the captured image. In the present exemplary embodiment, light amount correction processing of the viewpoint image is executed based on the projection signal of the captured image and the projection signal of the view point image.

Accordingly, in the present exemplary embodiment, a viewpoint image of favorable image quality can be generated through the above-described configuration.

<Defect Correction of Viewpoint Image>

In step S2 in FIG. 9, based on the captured image I of the present exemplary embodiment, defect correction is executed on the k-th viewpoint (first corrected) image $M_1I_k$ after shading correction. In the present exemplary embodiment, a value k is specified as 1 (k=1).

In the present exemplary embodiment, due to a short circuit of a transfer gate caused by a circuit configuration or a driving method of the image sensor, a defective signal may occur in only a part of the k-th viewpoint image $I_k$ (the first viewpoint image $I_1$) to cause a point defect or a line defect even though the captured image I is normal. Information about a point defect or a line defect inspected at a mass-production line may be previously stored in an image processing circuit 125, and defect correction processing of the k-th viewpoint image $I_k$ (first viewpoint image $I_1$) may be executed by using the stored point defect information or line defect information, as appropriate. Further, point defect determination or line defect determination may be executed by inspecting the k-th viewpoint image $I_k$ (first viewpoint image $I_1$) on a real-time bases as appropriate.

The defect correction executed in step S2 in FIG. 9 will be described with respect to the case where an odd-numbered row $2j_D-1$ or an even-numbered row $2j_D$ of the k-th viewpoint image $I_k$ is determined to be a line defect arising in the horizontal direction (x-direction) whereas an odd-numbered row $2j_D-1$ or an even-numbered row $2j_D$ of the captured image I is not determined to be a line defect.

In the defect correction executed in step S2 of the present exemplary embodiment, defect correction is executed on the k-th viewpoint (first corrected) image $M_1I_k$ based on the captured image I, taking the normal captured image I as a reference image. The defect correction of the present exemplary embodiment will be executed by comparing a signal value of the k-th viewpoint (first corrected) image $M_1I_k$ of a position which is determined to be non-defective and a signal value of the captured image I of a position which is determined to be non-defective. When this comparison is made, the influence of shading components of each color of RGB of the k-th viewpoint image $I_k$ caused by a pupil shift is eliminated, and signal components of each color of RGB included in the object in the k-th viewpoint image $I_k$ and the captured image I are compared precisely, so that defect correction can be executed with high precision. Accordingly, in step S1, shading (light amount) correction is previously executed on each color of RGB of the k-th viewpoint image, and the k-th viewpoint (first corrected) image $M_1I_k$ that is brought into a shading state similar to that of the captured image I is generated. Then, the influence of shading components is eliminated. Thereafter, in step S2, based on the captured image I, highly-precise defect correction is executed on the k-th viewpoint (first corrected) image $M_1I_k$ after shading correction.

In step S2 in FIG. 9, with respect to the signal of the k-th viewpoint (first corrected) image $M_1I_k$ (j, i) after shading correction which is determined to be defective only in a small portion thereof, defect correction processing is executed so that a k-th viewpoint (second corrected) image $M_2I_k$ (j, i) after defect correction is generated from the normal signal of the captured image I and the normal signal of the k-th viewpoint (first corrected) image $M_1I_k$. Herein, the k-th viewpoint (second corrected) images $M_2I_k$ in the respective R, Gr, Gb, and B arranged in the Bayer array are referred to as k-th viewpoint (second corrected) images $RM_2I_k$, $GrM_2I_k$, $GbM_2I_k$, and $BM_2I_k$, and respectively defined as $RM_2I_k$ ($2j_2-1$, $2i_2-1$)=$M_2I_k$ ($2j_2-1$, $2i_2-1$), $GrM_2I_k$ ($2j_2-1$, $2i_2$)=$M_2I_k$ ($2j_2-1$, $2i_2$), $GbM_2I_k$ ($2j_2$, $2i_2-1$)=$M_2I_k$ ($2j_2$, $2i_2-1$), and $BM_2I_k$ ($2j_2$, $2i_2$)=$M_2I_k$ ($2j_2$, $2i_2$).

In step S2, if the k-th viewpoint (first corrected) image $RM_1I_k$ at the first position ($2j_D-1$, $2i_D-1$) is determined to be defective, defect correction is executed using the formula 7A, so that the k-th viewpoint (second corrected) image $RM_2I_k$ ($2j_D-1$, $2i_D-1$) at the first position after defect correction is generated from the captured image RI ($2j_D-1$, $2i_D-1$) at the first position, the k-th viewpoint (first corrected) image $RM_1I_k$ at the second position which is determined to be non-defective, and the captured image RI at the second position.

If the k-th viewpoint (first corrected) image $GrM_1I_k$ at the first position ($2j_D-1$, $2i_D$) is determined to be defective, defect correction is executed using the formula 7B, so that the k-th viewpoint (second corrected) image $GrM_2I_k$ $92j_D-1$, $2i_D$) at the first position after defect correction is generated from the captured image GrI ($2j_D-1$, $2i_D$) at the first position, the k-th viewpoint (first corrected) image $GbM_1I_k$ at the second position which is determined to be non-defective, and the captured image GbI at the second position.

If the k-th viewpoint (first corrected) image $GbM_1I_k$ at the first position ($2j_D$, $2i_D-1$) is determined to be defective, defect correction is executed using the formula 7C, so that the k-th viewpoint (second corrected) image $GbM_2I_k$ ($2j_D$, $2i_D1$) at the first position after defect correction is generated from the captured image GbI ($2j_D$, $2i_D-1$) at the first position, the k-th viewpoint (first corrected) image $GrM_1I_k$ at the second position which is determined to be non-defective, and the captured image GrI at the second position.

If the k-th viewpoint (first corrected) image $BM_1I_k$ at the first position ($2j_D$, $2i_D$) is determined to be defective, defect correction is executed using the formula 7D, so that the k-th viewpoint (second corrected) image $BM_2I_k$ ($2j_D$, $2i_D$) at the first position after defect correction is generated from the captured image BI ($2j_D$, $2i_D$) at the first position, the k-th viewpoint (first corrected) image $BM_1I_k$ at the second position which is determined to be non-defective, and the captured image BI at the second position.

<Formula 7A>

$$RM_2I_k(2j_D-1, 2i_D-1) = RI(2j_D-1, 2i_D-1) \times \frac{\sum_{\tau=\pm 2}\sum_{\sigma=0,\pm 2} RM_1I_k(2j_D-1+\tau, 2i_D-1+\sigma)}{\sum_{\tau=\pm 2}\sum_{\sigma=0,\pm 2} RI(2j_D-1+\tau, 2i_D-1+\sigma)},$$

<Formula 7B>

$$G_rM_2I_k(2j_D-1, 2i_D) = G_rI(2j_D-1, 2i_D) \times \frac{\sum_{\tau=\pm 1}\sum_{\sigma=\pm 1} G_bM_1I_k(2j_D-1+\tau, 2i_D+\sigma)}{\sum_{\tau=\pm 1}\sum_{\sigma=\pm 1} G_bI(2j_D-1+\tau, 2i_D+\sigma)},$$

<Formula 7C>

$$G_bM_2I_k(2j_D, 2i_D-1) = G_bI(2j_D, 2i_D-1) \times \frac{\sum_{\tau=\pm 1}\sum_{\sigma=\pm 1} G_rM_1I_k(2j_D+\tau, 2i_D-1+\sigma)}{\sum_{\tau=\pm 1}\sum_{\sigma=\pm 1} G_rI(2j_D+\tau, 2i_D-1+\sigma)},$$

<Formula 7D>

$$BM_2I_k(2j_D, 2i_D) = BI(2j_D, 2i_D) \times \frac{\sum_{\tau=\pm 2}\sum_{\sigma=0,\pm 2} BM_1I_k(2j_D+\tau, 2i_D+\sigma)}{\sum_{\tau=\pm 2}\sum_{\sigma=0,\pm 2} BI(2j_D+\tau, 2i_D+\sigma)}.$$

In most of the positions (j, i) other than the above positions which are determined to be non-defective, the k-th viewpoint (second corrected) image $M_2I_k$ (j, i) has a signal value the same as that of the k-th viewpoint (first corrected) image $M_1I_k$ (j, i), i.e., $M_2I_k$ (j, i)=$M_1I_k$ (j, i).

The k-th viewpoint image (second corrected) image $M_2I_k$ (j, i) after defect correction may be specified as an output image as appropriate.

Figure 15:
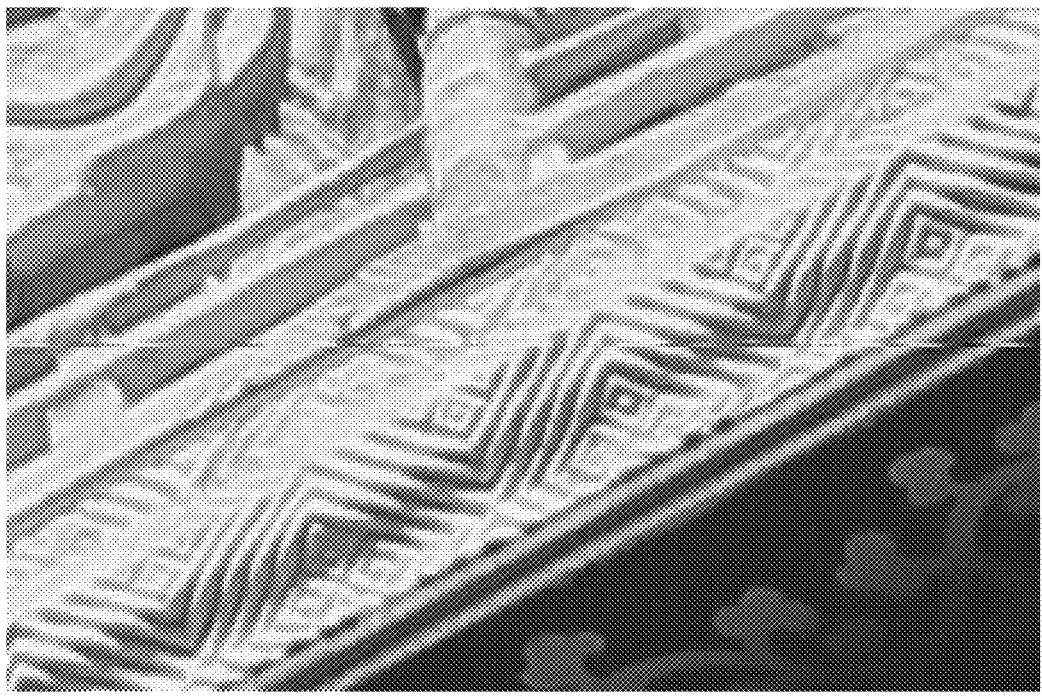
FIG. 15 is a diagram illustrating an example of a first viewpoint image before defect correction according to the first exemplary embodiment of the present invention.
Figure 16:
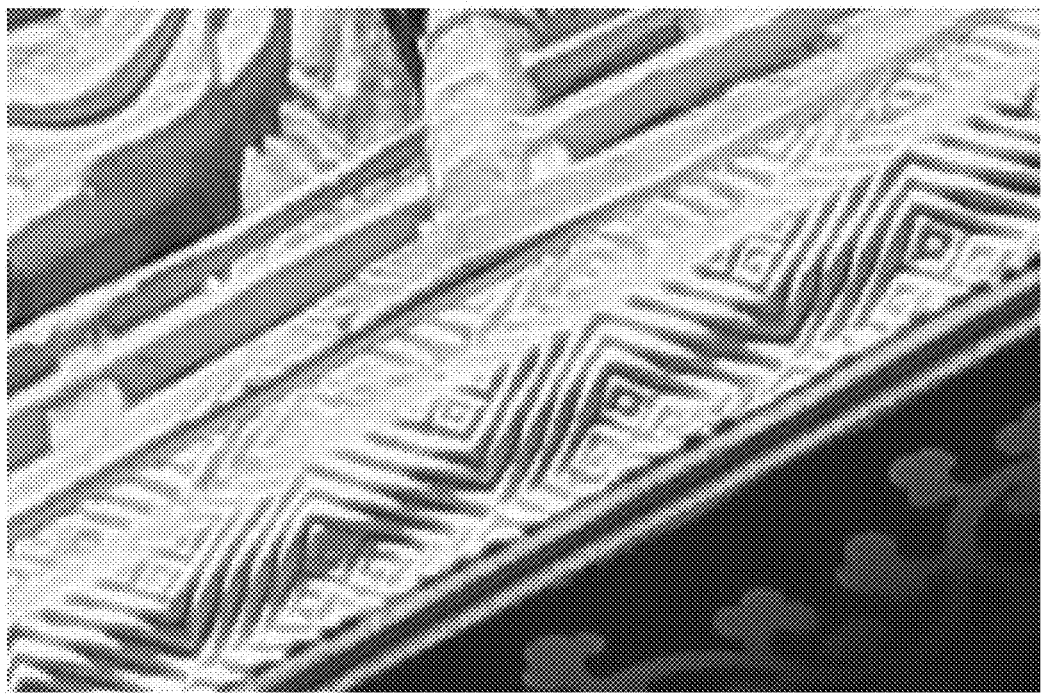
FIG. 16 is a diagram illustrating an example of a first viewpoint image after defect correction according to the first exemplary embodiment of the present invention.

Hereinafter, effect of the defect correction in step S2 in FIG. 9 of the present exemplary embodiment, executed on the first viewpoint (first corrected) image Mi$I_1$ based on the normal captured image I, will be described with reference to FIGS. 15 and 16. FIG. 15 is a diagram illustrating an example of the first viewpoint (first corrected) image $M_1 I_1$ (after shading correction and de-mosaicing) before executing defect correction of the present exemplary embodiment. In FIG. 15, a line defect in a horizontal direction (x-direction) is present at a central portion of the first viewpoint (first corrected) image $M_1 I_1$ (j, i). FIG. 16 is a diagram illustrating an example of the first viewpoint (second corrected) image $M_2 I_1$ (after shading correction and de-mosaicing) after executing defect correction of the present exemplary embodiment. The line defect arising in the horizontal direction (x-direction) is corrected through the defect correction based on the normal captured image I. As a result, similar to the captured image I, the first viewpoint (second corrected) image $M_2 I_1$ (j, i) of favorable image quality after defect correction is generated.

In the present exemplary embodiment, from the input image acquired by the image sensor in which a plurality of pixels each having a plurality of photoelectric conversion parts for receiving a light flux passing through the different pupil partial regions of the image-forming optical system is arrayed, a captured image corresponding to a pupil region in which different pupil partial regions are combined is generated. Then, a plurality of viewpoint images is generated at each of the different pupil partial regions and image processing for correcting the viewpoint image is executed based on the captured image to generate an output image. In the present exemplary embodiment, image processing of correcting and reducing the defects included in the viewpoint image is executed based on the captured image. In the present exemplary embodiment, image processing of correcting the signal value of the viewpoint image at the first position determined to be defective is executed by using the signal value of the captured image at the first position. In the present exemplary embodiment, image processing of correcting the signal value of the viewpoint image at the first position is executed based on a signal value of the captured image at the first position determined to be defective, a signal value of the viewpoint image at the second position determined to be non-defective, and a signal value of the captured image at the second position.

In the present exemplary embodiment, after light amount correction processing is executed on the viewpoint image based on the captured image, image processing of correcting and reducing the defects included in the viewpoint image is executed based on the captured image.

Accordingly, in the present exemplary embodiment, a viewpoint image of favorable image quality can be generated through the above-described configuration.

In step S3 in FIG. 9, saturation signal processing is executed on the captured image I (j, i) and the k-th viewpoint (second corrected) image $M_2 I_k$ (j, i). In the present exemplary embodiment, values of "k" and "$N_{LF}$" are specified as "1" and "2" (k=1, $N_{LF}$=2), respectively.

First, in step S3, a maximum value of an imaging signal is represented as "Imax", and saturation signal processing is executed on the captured image I (j, i) using the following formula 8, so that a corrected captured image MI (j, i) is generated. Herein, the maximum value Imax of the imaging signal and a saturation determination threshold value IS of the imaging signal satisfy the condition Imax≥IS.

<Formula 8>

$$MI(j, i) = \begin{cases} I_{max}, & I(j, i) > I_{max}, \\ I(j, i), & \text{otherwise.} \end{cases} \quad (8)$$

In the present exemplary embodiment, due to a driving method or an A/D conversion circuit structure of the image sensor, with respect to the maximum signal value Imax of the captured image I (j, i) at the time of saturation, a maximum signal value $I_k$max of the k-th viewpoint (second corrected) image $M_2 I_k$ (j, i) at the time of saturation has a value greater than a value Imax/2 and equal to or less than a value Imax (Imax/2<$I_k$max≤Imax). In the present exemplary embodiment, the maximum signal value $I_k$max of the k-th viewpoint (second corrected) image $M_2 I_k$ (j i) at the time of saturation is equal to the maximum signal value Imax of the captured image I (j, i) at the time of saturation ($I_k$max=Imax).

In step S3 in FIG. 9, lastly, saturation signal processing is executed on the k-th viewpoint (second corrected) image $M_2 I_k$ (j, i) using the formula 9, and a k-th corrected viewpoint image $MI_k$ (j, i) is generated as an output image. Herein, the maximum value $I_k$max of the k-th corrected viewpoint image and a saturation determination threshold value $IS_k$ of the k-th corrected viewpoint image satisfy the condition $I_k$max $IS_k$.

<Formula 9>

$$MI_k(j, i) = \begin{cases} I_{k\ max}, & M_2 I_k(j, i) > I_{k\ max}, \\ M_2 I_k(j, i), & \text{otherwise.} \end{cases} \quad (9)$$

The aperture stop of the first corrected viewpoint image (the second corrected viewpoint image) corresponds to the first pupil partial region 501 (the second pupil partial region 502), and the effective aperture value of the first corrected viewpoint image (the second corrected viewpoint image) is greater (darker) than the aperture value of the captured image. Therefore, if images are captured at the same exposure time, the captured image has a large signal value because the captured image receives a relatively large amount of light from the object, whereas the first corrected viewpoint image (the second corrected viewpoint image) has a small signal value because the first corrected viewpoint image (the second corrected viewpoint image) receives a relatively small amount of light from the object.

Figure 17:
FIG. 17 is a diagram illustrating an example of a captured image according to the first exemplary embodiment of the present invention.
Figure 18:
FIG. 18 is a diagram illustrating an example of a first corrected viewpoint image after correction according to the first exemplary embodiment of the present invention.

Hereinafter, generation of an output image with an expanded dynamic range according to the present exemplary embodiment will be described with reference to FIGS. 17 to 20. FIG. 17 is a diagram illustrating an example of a captured image including a saturated pixel of the present exemplary embodiment. The sky having a high object luminance level is captured in a space between a tree having a low object luminance level, so that saturation occurs in the captured image. On the other hand, FIG. 18 is a diagram illustrating an example of the first corrected viewpoint image of the present exemplary embodiment. The effective aperture value of the first corrected viewpoint image of the present exemplary embodiment is approximately one-stage greater (darker) than the aperture value of the captured image, so that a light amount received from the object is approximately half of a received light amount of the captured image. Therefore, a region of the sky having a high object luminance level is not saturated, and object information is acquired precisely.

Figure 19:
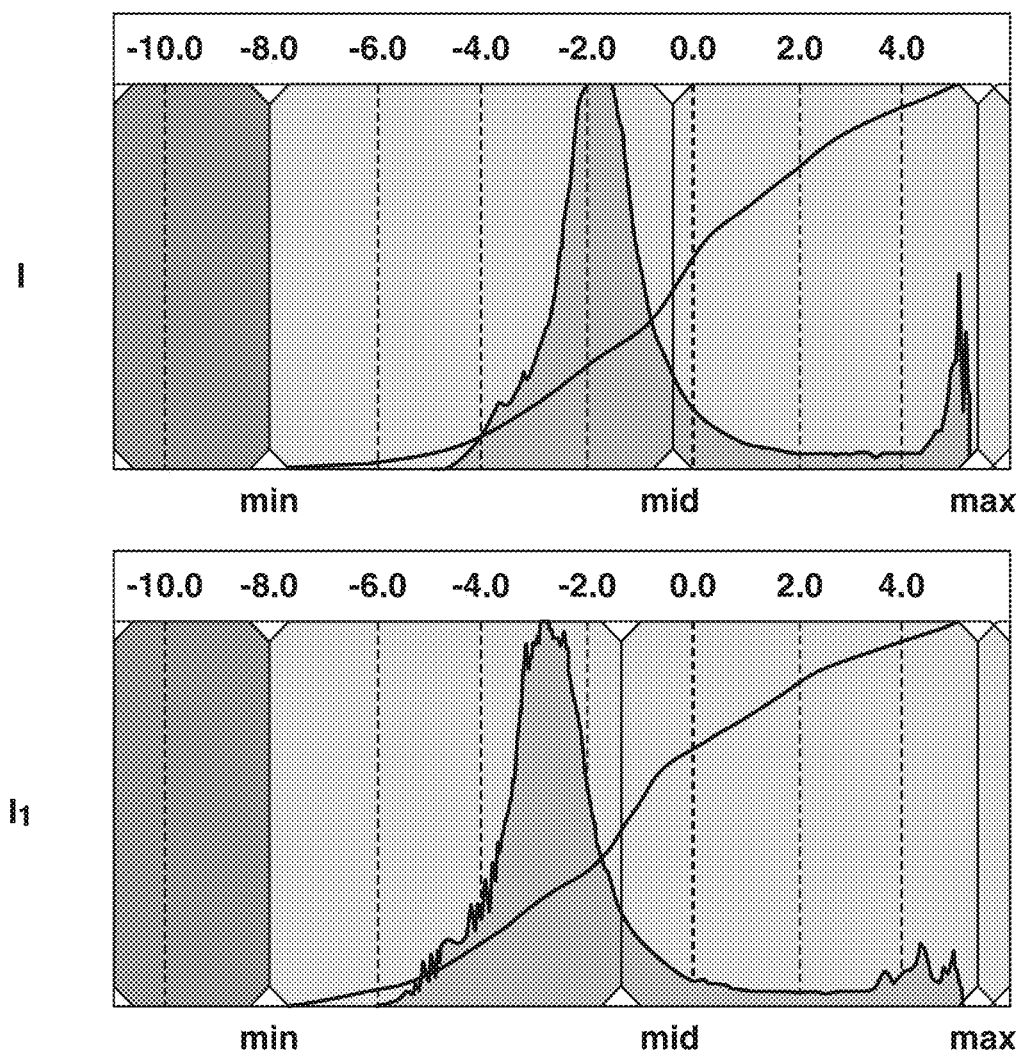
FIG. 19 is a diagram illustrating examples of a signal luminance distribution of a captured image and a signal luminance distribution according to a first corrected viewpoint image of the first exemplary embodiment of the present invention.
Figure 20:
FIG. 20 is a diagram illustrating an example of an output image with an expanded dynamic range generated by combining a captured image and a first corrected viewpoint image according to the first exemplary embodiment of the present invention.

A signal luminance distribution of the captured image illustrated in FIG. 17 and a signal luminance distribution of the first corrected viewpoint image illustrated in FIG. 18 are respectively illustrated in the upper and the lower portions of FIG. 19. In FIG. 19, a horizontal axis represents a value in which a luminance signal value Y is converted into stage count using a formula log2 $(Y/Y_0)$, where a standard luminance signal value is represented as $Y_0$. In FIG. 19, the signal luminance value is greater on the right side and smaller on the left side. A vertical axis represents pixel count (pixel frequency) having the luminance signal value log2 $(Y/Y_0)$. When peaks of the signal luminance distribution of the captured image and the signal luminance distribution of the first corrected viewpoint image are compared against each other, a signal amount of the first corrected viewpoint image is approximately one stage lower than (i.e., approximately one-half of) a signal amount of the captured image. Therefore, a signal is not saturated on the high luminance side corresponding to the region of the sky, and object information is acquired precisely.

Accordingly, the captured image is combined at a ratio higher than that of the k-th corrected viewpoint image in a region with a low object luminance level, whereas the captured image is combined at a ratio lower than that of the k-th corrected viewpoint image in a region with a high object luminance level, so that an output image with the expanded dynamic range can be generated.

In FIG. 19, a minimum signal luminance min and a maximum signal luminance max respectively indicate signal luminance ranges min and max used for development processing such as de-mosaic processing. A curved line that connects the minimum signal luminance min and the maximum signal luminance max indicates a gamma adjustment value (gamma curve), and an intermediate signal luminance mid indicates a signal luminance as an intermediate value of the minimum signal luminance min and the maximum signal luminance max after gamma adjustment. A gamma adjustment value can be set by adjusting the minimum signal luminance min, the maximum signal luminance max, and the intermediate signal luminance mid.

An output image with the expanded dynamic range is generated by combining the captured image and the k-th corrected viewpoint image.

First, in FIG. 19, the intermediate signal luminance mid of the captured image is set to be greater than that of the k-th corrected viewpoint image. Then, gamma adjustment values of the captured image and the k-th corrected viewpoint image are set respectively.

Next, a captured image after gamma adjustment which is corrected by the set gamma adjustment value of the captured image and a k-th corrected viewpoint image after gamma adjustment which is corrected by the set gamma adjustment value of the k-th corrected viewpoint image are generated. Herein, an intermediate signal value of the captured image (or the k-th corrected viewpoint image) after gamma adjustment is referred to as a determination signal value.

Lastly, the captured image after gamma adjustment is combined with the k-th corrected viewpoint image after gamma adjustment at a ratio higher than that of the k-th corrected viewpoint image after gamma adjustment if the captured image after gamma adjustment has a signal value equal to or less than the determination signal value, and the captured image after gamma adjustment is combined with the k-th corrected viewpoint image after gamma adjustment at a ratio lower than that of the k-th corrected viewpoint image after gamma adjustment if the captured image after gamma adjustment has a signal value greater than the determination signal value, so that an output image with an expanded dynamic range is generated.

Through the above-described processing, a combination ratio of the captured image is set to be higher than that of the k-th corrected viewpoint image in the region with low object luminance level, whereas the combination ratio of the captured image is set to be lower than that of the k-th corrected viewpoint image in the region with high object luminance level, so that an output image with an expanded dynamic range can be generated.

The minimum signal luminance min of the captured image and the minimum signal luminance min of the k-th corrected viewpoint image may be set to substantially equal values, and the maximum signal luminance max of the captured image and the maximum signal luminance max of the k-th corrected viewpoint image may be set to substantially equal values. Further, a value acquired by subtracting an average value of the signal luminance distribution of the k-th corrected viewpoint image from an average value of the signal luminance distribution of the captured image is a signal luminance difference amount, and the intermediate signal luminance mid of the captured image may be set to a value substantially greater than the intermediate signal luminance mid of the k-th corrected viewpoint image by the signal luminance difference amount.

In the present exemplary embodiment, when the output image with an expanded dynamic range is generated by combining the captured image and the k-th corrected viewpoint image, an adjustment screen for allowing a user to adjust the respective gamma adjustment values (gamma curves) of the captured image and the k-th corrected viewpoint image is displayed according to the signal luminance distributions of the captured image and the k-th corrected viewpoint image.

As illustrated in FIG. 19, the signal luminance distribution, the minimum signal luminance min, the maximum signal luminance max, the intermediate signal luminance mid, and the gamma adjustment value (gamma curve) of the captured image and the k-th corrected viewpoint image are arranged and displayed vertically or horizontally, and respective gamma adjustment values (gamma curves) are set by the user input.

The signal luminance distribution, the minimum signal luminance min, the maximum signal luminance max, the intermediate signal luminance mid, and the gamma adjustment value (gamma curve) of the captured image and the k-th corrected viewpoint image may be overlapped and arranged on the same screen with different color combinations as appropriate.

The image processing apparatus of the present exemplary embodiment is an image processing apparatus including an image processing unit that executes the above-described image processing method. Further, the image processing apparatus includes a unit for displaying the signal luminance distribution of the captured image and the signal luminance distributions of one or more corrected viewpoint images, and a unit for receiving a plurality of user setting values used for gamma adjustment of the captured image and the one or more corrected viewpoint images.

The imaging apparatus of the present exemplary embodiment is an imaging apparatus including an image sensor in which a plurality of pixels each having a plurality of sub-pixels for receiving a light flux passing through different pupil partial regions of the image-forming optical system is arrayed and an image processing unit for executing the above-described image processing method. Further, the imaging apparatus includes a unit for displaying the signal luminance distribution of the captured image and the signal luminance distributions of one or more corrected viewpoint images, and a unit for receiving a plurality of user setting values used for gamma adjustment of the captured image and the one or more corrected viewpoint images.

Through the configuration of the present exemplary embodiment, an image of favorable image quality with an expanded dynamic range can be generated.

Subsequently, a second exemplary embodiment of the present invention will be described. Herein, detailed description of the constituent elements similar to those described in the first exemplary embodiment will be omitted while the reference numerals already used in the first exemplary embodiment are applied thereto, and differences will be mainly described.

Figure 21:
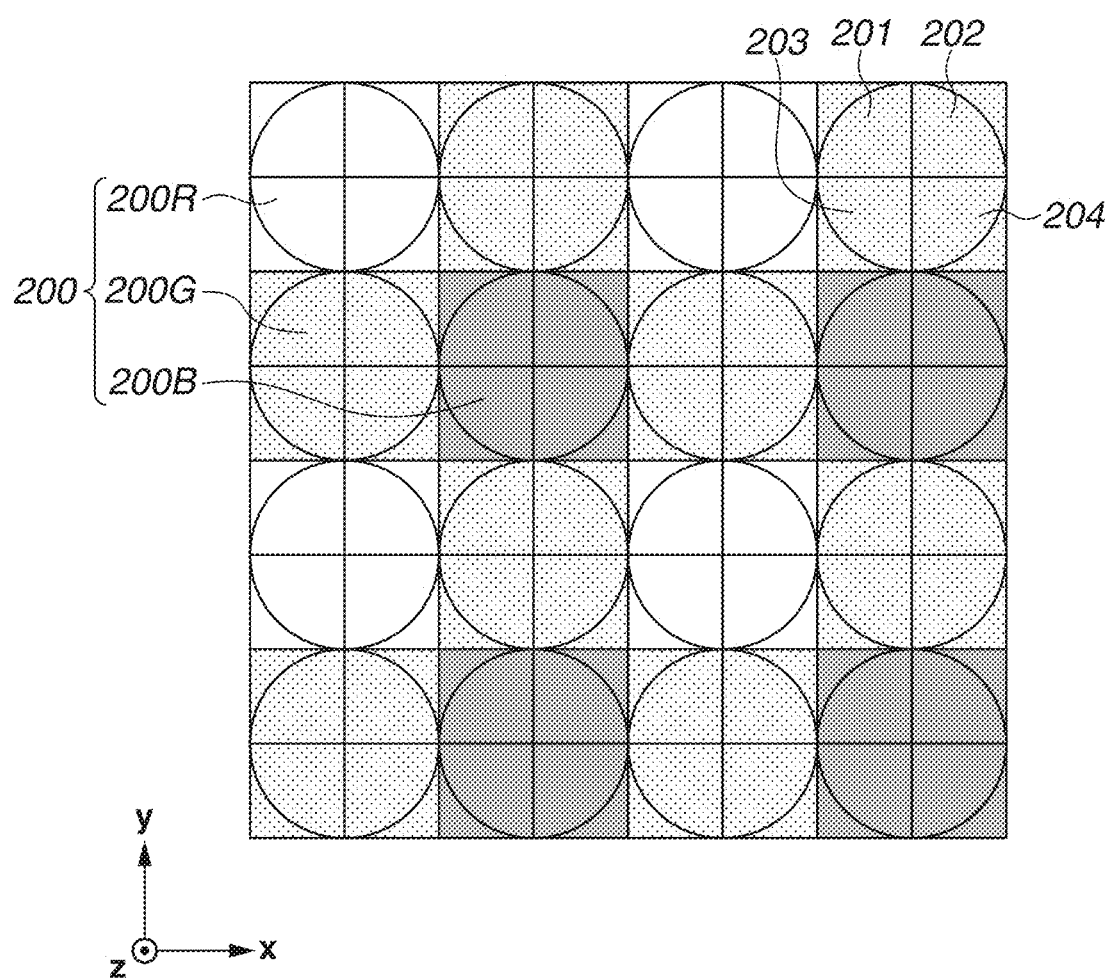
FIG. 21 is a diagram schematically illustrating pixel array according to a second exemplary embodiment of the present invention.

FIG. 21 is a diagram schematically illustrating pixel array and sub-pixel array of the image sensor of the present exemplary embodiment. In FIG. 21, a right-left direction is defined as an x-direction (horizontal direction), an up-down direction is defined as a y-direction (vertical direction), and a direction orthogonal to the x-direction and the y-direction (direction vertical to a sheet surface) is defined as a z-direction (optical axis direction). In FIG. 21, pixel (imaging pixel) array of a two-dimensional CMOS sensor (image sensor) of the present exemplary embodiment is illustrated in a range of 4 columns by 4 rows, and sub-pixel array thereof is illustrated in a range of 8 columns by 8 rows.

In the present exemplary embodiment, a pixel group 200 which consists of 2 columns by 2 rows of pixels includes a pixel 200R having spectral sensitivity of a first color (red (R)) arranged at an upper left position, pixels 200G having spectral sensitivity of a second color (green (G)) arranged at an upper right and a lower left positions, and a pixel 200B having spectral sensitivity of a third color (blue (B)) arranged at a lower right position. Further, each pixel consists of a plurality of sub-pixels obtained by dividing each pixel into two in the x-direction (divided into Nx) and dividing each pixel into two in the y-direction (divided into Ny), i.e., a first sub-pixel 201 to a fourth sub-pixel 204 (the first to the $N_{LF}$-th sub-pixels) obtained by dividing each pixel by a division number of 4 (division number $N_{LF}$=Nx× Ny).

In the example illustrated in FIG. 21, by arranging a plurality of pixels arrayed in 4 columns by 4 rows (sub-pixels arrayed in 8 columns by 8 rows) on a plane, an input image for generating a captured image and a plurality of viewpoint images corresponding to a division number of 4 (division number $N_{LF}$) can be acquired. In the image sensor of the present exemplary embodiment, a period P of the pixel is set to 6 micrometers (μm), horizontal (column direction) pixel count $N_H$ is set to 6000 columns ($N_H$=6000 columns), vertical (row direction) pixel count $N_V$ is set to 4000 rows ($N_V$=4000 rows), so that pixel count N is set to 24 million (N=$N_H$×$N_V$=24 million). Further, a period $P_s$ of the sub-pixel is set to 3 μm, and sub-pixel count $N_s$ is set to 96 million (i.e., horizontal pixel count of 12000 columns by vertical pixel count of 8000 rows equal to 96 million).

One pixel 200G of the image sensor in FIG. 21 viewed on a side of a light receiving plane (+z side) of the image sensor is illustrated in a plan view in FIG. 22A. A z-axis is set in a direction vertical to a sheet surface of FIG. 22A, and a front side thereof is defined as a positive direction of the z-axis. Further, a y-axis is set in an up-down direction orthogonal to the z-axis, and an upper direction is defined as a positive direction of the y-axis. Furthermore, an x-axis is set in a right-left direction orthogonal to the z-axis and the y-axis, and a right direction is defined as a positive direction of the x-axis. A cross-sectional view taken along a line A-A in FIG. 22A, viewed on the −y side is illustrated in FIG. 22B.

As illustrated in FIG. 22A or 22B, a micro-lens 305 for collecting incident light is formed on a side of a light receiving plane (+z direction) of each pixel 200G. Further, each photoelectric conversion portion is divided into two in the x-direction (divided into Nx) and divided into two in the y-direction (divided into Ny) and therefore a plurality of photoelectric conversion parts, i.e., a first photoelectric conversion part 301 to a fourth photoelectric conversion part 304 (the first to the $N_{LF}$-th photoelectric conversion parts) obtained by dividing each photoelectric conversion portion by a division number of 4 (division number $N_{LF}$), are formed on the pixel 200G. The first photoelectric conversion part 301 to the fourth photoelectric conversion part 304 (the first to the $N_{LF}$-th photoelectric conversion parts) respectively correspond to the first sub-pixel 201 to the fourth sub-pixel 204 (the first to the $N_{LF}$-th sub-pixels).

Figure 23:
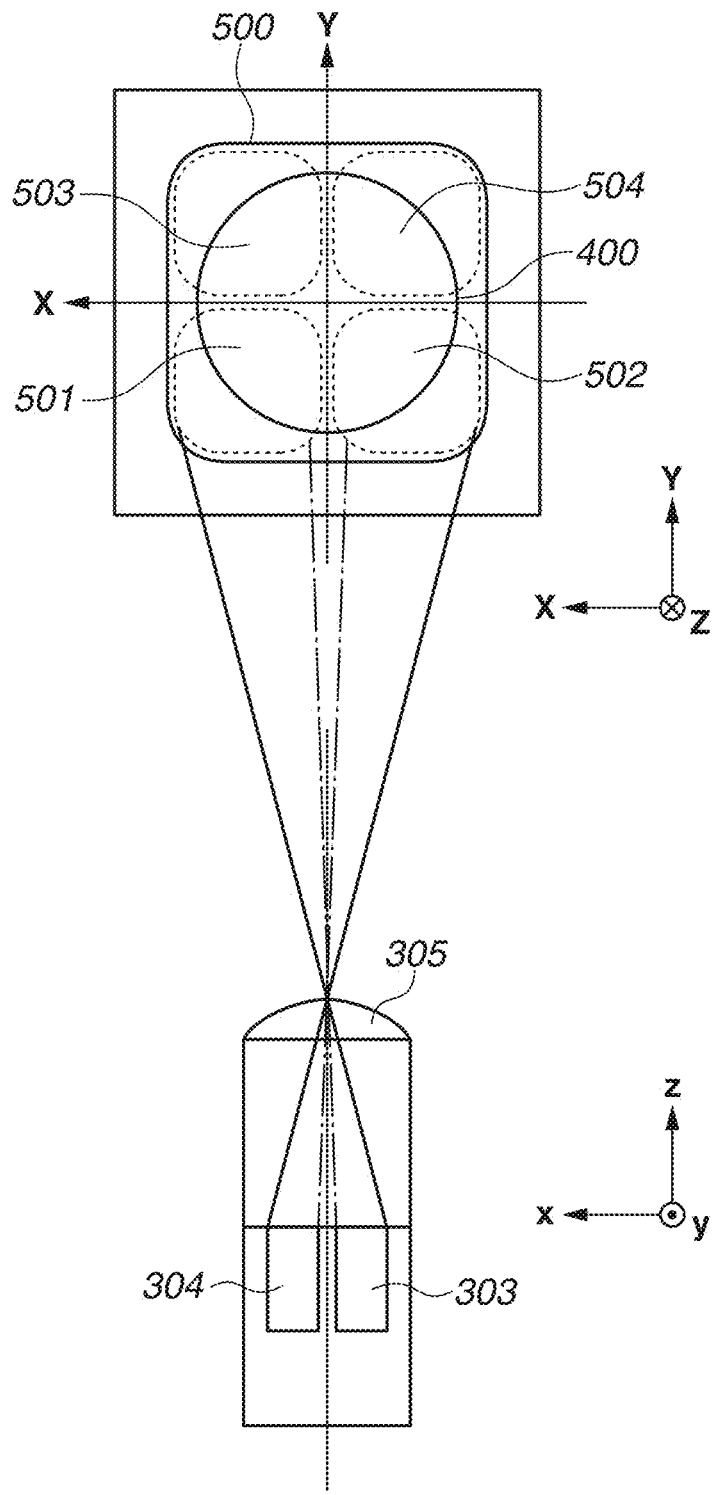
FIG. 23 is a diagram schematically illustrating a pixel and pupil division according to the second exemplary embodiment of the present invention.

FIG. 23 is a diagram schematically illustrating a correspondence relationship between a pixel structure and pupil division. A cross-sectional view of the pixel structure taken along a line A-A in FIG. 22A, viewed on the +y direction and a diagram in which an exit pupil plane of the image-forming optical system is viewed in the −z direction are illustrated in FIG. 23. In FIG. 23, the x-axis and the y-axis of the cross-sectional diagram in FIG. 22A are illustrated in an inverted state in order to make the x and y axes correspond to the coordinate axes of the exit pupil plane.

The image sensor is arranged near an image-forming plane of the imaging lens (image-forming optical system), and a light flux from an object passes through the exit pupil 400 of the image-forming system and enters the respective pixels. A plane on which the image sensor is arranged is referred to as an imaging plane.

Each of a first pupil partial region 501 to a fourth pupil partial region 504 obtained by dividing the pupil region 500 into 2×2 (the first to the $N_{LF}$-th pupil partial regions obtained by dividing the pupil region 500 into Nx×Ny) respectively has a substantially optically conjugate relationship with a light receiving plane of the first photoelectric conversion part 301 to the fourth photoelectric conversion part 304 (the first to the $N_{LF}$-th photoelectric conversion parts) via the micro-lens 305. Therefore, the first pupil partial region 501 to the fourth pupil partial region 504 are pupil regions where light can be respectively received by the first sub-pixel 201 to the fourth sub-pixel 204 (the first to the $N_{LF}$-th sub-pixels). A centroid is decentered on the +X side and the −Y side on a pupil plane in the first pupil partial region 501 of the first sub-pixel 201. A centroid is decentered on the −X side and the −Y side on a pupil plane in the second pupil partial region 502 of the second sub-pixel 202. A centroid is decentered on the +X side and the +Y side on a pupil plane in the third pupil partial region 503 of the third sub-pixel 203. A centroid is decentered on the −X side and the +Y side on a pupil plane in the fourth pupil partial region 504 of the fourth sub-pixel 204.

In each of the pixels of the image sensor of the present exemplary embodiment, the first sub-pixel 201 to the fourth sub-pixel 204 obtained by dividing each pixel into 2×2 (the first to the $N_{LF}$-th sub-pixels obtained by dividing each pixel into Nx×Ny) respectively receive light fluxes passing through different pupil partial regions of the image-forming optical system, i.e., the first pupil partial region 501 to the fourth pupil partial region 504 (the first to the $N_{LF}$-th pupil partial regions). The LF data (input image) illustrating a spatial distribution and an angle distribution of light intensity is acquired from a signal received at each sub-pixel.

In the present exemplary embodiment, a pixel is divided into four sub-pixels (i.e., Nx=2, Ny=2, and $N_{LF}$=4), and from the input image (LF data) corresponding to the pixel array illustrated in FIG. 21, a captured image configured of RGB signals in the Bayer array having a resolution of the pixel count N (N=horizontal pixel count $N_H$×vertical pixel count $N_V$) is generated by combining all of the signals of the first sub-pixel 201 to the fourth sub-pixel 204, obtained by dividing each pixel into four (the first to the $N_{LF}$-th sub-pixels obtained by dividing each pixel into Nx×Ny) at each of the pixels using the formula 1.

In the present exemplary embodiment, a pixel is divided into four sub-pixels (Nx=2, Ny=2, and $N_{LF}$=4), and a value k is specified as 1 to 3. From the LF data (input image) corresponding to the pixel array illustrated in FIG. 21, a signal of the first sub-pixel 201 is selected from among the signals of the first sub-pixel 201 to the fourth sub-pixel 204, obtained by dividing each pixel into four, and a first viewpoint image $I_1$ (j, i) configured of the RGB signal in the Bayer array having a resolution of the pixel count N, which corresponds to the first pupil partial region 501 of the image-forming system, is generated at each of the pixels using the formula 2. Further, from the LF data, a signal of the second sub-pixel 202 is selected from among the signals of the first sub-pixel 201 to the fourth sub-pixel 204, each of which is obtained by dividing each pixel into four, and a second viewpoint image $I_2$ (j, i) configured of the RGB signal in the Bayer array having a resolution of the pixel count N, which corresponds to the second pupil partial region 502 of the image-forming system, is generated at each of the pixels using the formula 2. Furthermore, from the LF data, a signal of the third sub-pixel 203 is selected from among the signals of the first sub-pixel 201 to the fourth sub-pixel 204, obtained by dividing each pixel into four, and a third viewpoint image $I_3$ (j, i) configured of the RGB signal in the Bayer array having a resolution of the pixel count N, which corresponds to the third pupil partial region 503 of the image-forming system, is generated at each of the pixels using the formula 2.

As described above, in the present exemplary embodiment, from the input image (LF data) acquired by the image sensor in which a plurality of pixels each having a plurality of photoelectric conversion parts for receiving a light flux passing through the different pupil partial regions of the image-forming optical system is arrayed, a captured image corresponding to a pupil region in which different pupil partial regions are combined is generated, and at least one or more viewpoint images are generated at each of the different pupil partial regions.

<Correction Processing of Viewpoint Image Based on Captured Image>

In the present exemplary embodiment, similar to the first exemplary embodiment, in order to generate a viewpoint image of favorable image quality, an output image is generated by executing image processing such as defect correction or shading correction on the first to the fourth viewpoint images (the first to the $N_{LF}$-th viewpoint images) based on the captured image.

In step S1 in FIG. 9, by taking the captured image I (j, i) as a reference image, shading (light amount) correction is executed on the first viewpoint image $I_1$ to the third viewpoint image $I_3$ (the k-th viewpoint image $I_k$: k=1 to $N_{LF}$−1) for each color of RGB. In the present exemplary embodiment, a pixel is divided into four portions (Nx=2, Ny=2, and $N_{LF}$=4), and a value k is specified as 1 to 3.

First, in step S1, with respect to the k-th viewpoint images $I_k$ (k=1 to $N_{LF}$−1), shading (light amount) correction processing is executed in the x-direction using the formulas 3A to 6D. Then, in the formulas 3A to 6D, the x-direction and the y-direction are replaced, and the k-th viewpoint (first corrected) image $M_1I_k$ (k=1 to $N_{LF}$−1) is generated by executing shading (light amount) correction processing in the y-direction. If shading (light amount) correction is executed in the x-direction and the y-direction by two steps, one pupil division number $N_{LF}$ for normalization becomes an extra in each of the formulas 4A to 4D. Therefore in the second shading (light amount) correction in the y-direction, multiplication of the pupil division number $N_{LF}$ for normalization is omitted from each of the formulas 4A to 4D.

Processing similar to the processing in the first exemplary embodiment will be executed in respective steps subsequent to step S2 in FIG. 9, so that an output image with an expanded dynamic range is generated.

Through the configuration of the present exemplary embodiment, an image of favorable image quality with an expanded dynamic range can be generated. With respect to a photoelectric conversion portion in each of the pixels in the image sensor, the division number may be further increased. For example, the photoelectric conversion portion may be divided into nine parts (Nx=3, Ny=3, and $N_{LF}$=9), or may be divided into sixteen parts (Nx=4, Ny=4, and $N_{LF}$=16).

The image processing apparatus of the present exemplary embodiment is an image processing apparatus including an image processing unit for executing the above-described image processing method.

The imaging apparatus of the present exemplary embodiment is an imaging apparatus which includes an image sensor in which a plurality of pixels each having a plurality of sub-pixels for receiving a light flux passing through the different pupil partial regions of the image-forming optical system is arrayed and the image processing unit for executing the above-described image processing method.

Through the configuration of the present exemplary embodiment, an image of favorable image quality with an expanded dynamic range can be generated.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-256758, filed Dec. 28, 2016, which is hereby incorporated by reference herein in its entirety.

What is claimed is:

1. An image processing method for generating an output image from an input image acquired by an image sensor in which a plurality of pixels each having a plurality of photoelectric conversion parts for receiving light fluxes passing through different pupil partial regions of an image-forming optical system is arrayed, the method comprising:
generating, from the input image, a captured image corresponding to a pupil region in which the different pupil partial regions are combined;
generating, from the input image, one or more viewpoint images at each of the different pupil partial regions;
generating one or more corrected viewpoint images by executing light amount correction processing on the viewpoint images based on the captured image and the viewpoint images;
executing gamma adjustment of the captured image and gamma adjustment of the one or more corrected viewpoint images based on a signal luminance distribution of the captured image and signal luminance distributions of the one or more corrected viewpoint images; and
generating an output image by combining the corrected viewpoint images and the captured image according to object luminance.

2. The image processing method according to claim 1, further comprising:
detecting an effective pixel in which signals of both of the captured image and the viewpoint image are effective; and
executing light amount correction processing of the viewpoint images based on the signals of the captured image and the viewpoint images of the effective pixel.

3. The image processing method according to claim 1, wherein the effective pixel is non-saturated and non-defective.

4. The image processing method according to claim 1, further comprising executing light amount correction processing of respective colors of the viewpoint images based on the captured image.

5. The image processing method according to claim 1, further comprising executing light amount correction processing of the viewpoint images based on a projection signal of the captured image and projection signals of the viewpoint images.

6. The image processing method according to claim 1, further comprising:
displaying a signal luminance distribution of the captured image and signal luminance distributions of the one or more corrected viewpoint images on a display unit; and
receiving a plurality of user setting values for executing gamma adjustment of the captured image and gamma adjustment of the one or more corrected viewpoint images.

7. An image processing apparatus comprising:
an acquisition unit configured to acquire an input image from an image sensor in which a plurality of pixels each having a plurality of photoelectric conversion parts for receiving light fluxes passing through different pupil partial regions of an image-forming optical system is arrayed;
a first generation unit configured to generate, from the input image, a captured image corresponding to a pupil region in which the different pupil partial regions are combined;
a second generation unit configured to generate one or more viewpoint images from the input image at each of the different pupil partial regions;
a correction unit configured to generate one or more corrected viewpoint images by executing light amount correction processing on the viewpoint images based on the captured image and the viewpoint images;
a gamma adjustment unit configured to execute gamma adjustment of the captured image and gamma adjustment of the one or more corrected viewpoint images based on a signal luminance distribution of the captured image and signal luminance distributions of the one or more corrected viewpoint images; and
a third generation unit configured to generate an output image by combining the corrected viewpoint images and the captured image according to object luminance.

8. An image processing apparatus comprising:
one or more processors; and
a memory storing instructions which, when the instructions are executed by the one or more processors, cause the image processing apparatus to function as:
an acquisition unit configured to acquire an input image from an image sensor in which a plurality of pixels each having a plurality of photoelectric conversion parts for receiving light fluxes passing through different pupil partial regions of an image-forming optical system is arrayed;
a first generation unit configured to generate, from the input image, a captured image corresponding to a pupil region in which the different pupil partial regions are combined;
a second generation unit configured to generate one or more viewpoint images from the input image at each of the different pupil partial regions;
a correction unit configured to generate one or more corrected viewpoint images by executing light amount correction processing on the viewpoint images based on the captured image and the viewpoint images; and
a gamma adjustment unit configured to execute gamma adjustment of the captured image and gamma adjustment of the one or more corrected viewpoint images based on a signal luminance distribution of the captured image and signal luminance distributions of the one or more corrected viewpoint images; and
a third generation unit configured to generate an output image by combining the corrected viewpoint images and the captured image according to object luminance.

* * * * *